(12) United States Patent
Nagao et al.

(10) Patent No.: US 10,067,270 B2
(45) Date of Patent: Sep. 4, 2018

(54) ELECTROMAGNETIC WAVE ABSORBING/RADIATING MATERIAL, METHOD OF MANUFACTURING SAME, AND INFRARED SOURCE

(71) Applicant: National Institute for Materials Science, Ibaraki (JP)

(72) Inventors: Tadaaki Nagao, Tsukuba (JP); Thang Duy Dao, Tsukuba (JP); Takahiro Yokoyama, Tsukuba (JP); Satoshi Ishii, Tsukuba (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 0 days.

(21) Appl. No.: 15/507,018

(22) PCT Filed: Aug. 10, 2015

(86) PCT No.: PCT/JP2015/072687
§ 371 (c)(1),
(2) Date: Feb. 27, 2017

(87) PCT Pub. No.: WO2016/031547
PCT Pub. Date: Mar. 3, 2016

(65) Prior Publication Data
US 2017/0219746 A1 Aug. 3, 2017

(30) Foreign Application Priority Data

Aug. 29, 2014 (JP) ................................. 2014-176247

(51) Int. Cl.
*G02B 5/20* (2006.01)
*G02B 5/00* (2006.01)
(Continued)

(52) U.S. Cl.
CPC .......... *G02B 5/003* (2013.01); *C23C 14/5873* (2013.01); *C23F 1/02* (2013.01);
(Continued)

(58) Field of Classification Search
CPC ...... G02B 5/208; G02B 5/003; G02B 5/0866; G02B 5/206; G02B 5/22; G02B 5/26;
(Continued)

(56) References Cited

U.S. PATENT DOCUMENTS 4,096,626 A * 6/1978 Olsen ...................... B41J 2/085
216/20
4,690,750 A * 9/1987 Roxlo .................... B01D 15/08
148/DIG. 160
(Continued)

FOREIGN PATENT DOCUMENTS

| JP | 61223703 A | 10/1986 |
|---|---|---|
| JP | 2011118347 A | 6/2011 |
| JP | 2013171177 A | 9/2013 |

OTHER PUBLICATIONS

Ikeda et al.,"Controlled Thermal Emission of Polarized Infrared Waves from Arrayed Plasmon Nanocavities", Appl. Phys. Lett. 92, 021117, pp. 1-4 (2008).
(Continued)

*Primary Examiner* — David A Vanore
(74) *Attorney, Agent, or Firm* — Hoffmann & Baron, LLP

(57) ABSTRACT

The present invention relates to an electromagnetic wave absorbing/radiating material which includes: a conductor; and a plurality of conductor discs disposed in an array above the surface of the conductor or a perforated conductor layer with a plurality of holes defined in an array above the surface of the conductor.

39 Claims, 13 Drawing Sheets

(51) Int. Cl.
| | |
|---|---|
| G02B 1/00 | (2006.01) |
| C23C 14/58 | (2006.01) |
| C23F 1/02 | (2006.01) |
| H05K 9/00 | (2006.01) |
| H01B 1/02 | (2006.01) |
| C23C 14/18 | (2006.01) |
| C23C 14/08 | (2006.01) |

(52) U.S. Cl.
CPC ............... *G02B 1/002* (2013.01); *H01B 1/02* (2013.01); *H05K 9/0088* (2013.01); *C23C 14/081* (2013.01); *C23C 14/18* (2013.01)

(58) Field of Classification Search
CPC ..... G02B 1/002; C23C 14/086; C23C 14/087; C23C 14/18; C23C 14/352; C23C 14/5873; H01L 21/02057; H01L 21/3065; H01L 21/31116; H01L 21/67023; H01L 31/0236; H01L 31/0288; H01L 31/0543; H01L 31/0547; H01L 31/1804; H01L 31/1864; H01L 31/1872
USPC ............. 174/261; 216/20, 27, 338.1, 339.11, 216/341.8; 257/E31.014, E31.13
See application file for complete search history.

(56) References Cited

U.S. PATENT DOCUMENTS

| | | | | |
|---|---|---|---|---|
| 4,859,806 | A * | 8/1989 | Smith .................. | H05K 1/0289 174/261 |
| 5,977,924 | A * | 11/1999 | Takei .................. | H01Q 21/068 343/700 MS |
| 7,087,456 | B2 * | 8/2006 | Gory .................. | B81C 1/00928 438/106 |
| 7,390,689 | B2 * | 6/2008 | Mazur ................ | H01L 31/0236 136/256 |
| 8,288,021 | B2 * | 10/2012 | Funakubo ................ | B22F 1/02 428/401 |
| 9,720,153 | B2 * | 8/2017 | Kiyoto .................. | G02B 5/206 |
| 9,816,176 | B2 * | 11/2017 | Sun ........................ | C23C 14/352 |
| 2010/0309539 | A1 | 12/2010 | Kaye et al. | |
| 2011/0111210 | A1 * | 5/2011 | Matsunami ........... | C03C 17/007 428/328 |
| 2013/0260113 | A1 * | 10/2013 | Hart ......................... | B32B 3/22 428/201 |
| 2015/0090881 | A1 * | 4/2015 | King .................. | G01N 21/3586 250/339.11 |
| 2015/0162203 | A1 * | 6/2015 | Kitamura ............ | H01L 21/3065 438/710 |

OTHER PUBLICATIONS

Sai et al., "Spectral Control of Thermal Emission by Periodic Microstructured Surfaces in the Near-Infrared Region" J. Opt. Soc. Am. A, vol. 18, Issue 7, pp. 1471-1476 (2001).

Aydin et al., "Broadband Polarization-Independent Resonant Light Absorption Using Ultrathin Plasmonic Super Absorbers", Nature Communications, 2:517, pp. 1-7 (2011).

Chen et al., "Dual-Band Perfect Absorber for Multispectral Plasmon-Enhanced Infrared Spectroscopy" ACS Nano, vol. 6, No. 9, pp. 7998-8006 (2012).

Nau, et al., "Hydrogen Sensor Based on Metallic Photonic Crystal Slabs", Optics Letters, vol. 35, No. 18, pp. 3150-3152 (2010).

Miyazaki et al., "Infrared Thermal-Emitting Metasurfaces for CO2 Monitoring", the 61st JSAP Spring Meeting Koen Yokoshu, 17p-F12-13 (2014).

Isa et al., "Particle Lithography from Colloidal Self-Assembly at Liquid-Liquid Interfaces", ACS Nano, vol. 4, No. 10, pp. 5665-5670 (2010).

Fuentes, et al., "Optical and Electronic Properties of TiC x N y Films," J. Appl. Phys., vol. 90, No. 6, pp. 2737-2743 (2001).

International Search Report for corresponding Application No. PCT/JP2015/072687, pp. 1-8, dated Oct. 27, 2015.

Liu, et al., "Infrared Perfect Absorber and Its Application as Plasmonic Sensor", Nano Letters, vol. 10, No. 7, pp. 2342-2348 (Jul. 14, 2010).

Lodewijks, et al., "Self-Assembeld Hexagonal Double Fishnets as Negative Index Materials", ARXIV. org, Cornell University Library, 201 Olin Library Cornell University Ithaca, NY 14853, 10 pages (Oct. 18, 2010).

Zhang, et al., "Collodial Lithography—The Art of Nanochemical Patterning", Chemistry—An Asian Journal, DE, vol. 4, No. 2, pp. 236-245 (Feb. 2, 2009).

Database Compendex [Online], Engineering Information, Inc., Newyork, NY, US; Jun. 18, 2014 (Jun. 18, 2014), Lecarme, et al., "Robust and Versatile Light Absorption at Near-Infrared Wavelengths by Plasmonic Aluminum Nanorods", XP002779527, Database accession No. E20151400706461 & ACS Photonics 20140618 American Chemical Society USA, vol. 1, No. 6, pp. 538-546, (Jun. 18, 2014).

Wu, et al., "Metamaterial-Based Integrated Plasmonic Absorber/ emitter for Solar Thermo-Photovoltaic Systems", Journal of Optics, Institute of Physics Publishing, Bristol GB, vol. 14, No. 2, 24005, 7 pages (Jan. 12, 2012).

Supplementary European Search Report for corresponding Application No. EP 15836691.4,10 pages, dated Apr. 11, 2018.

Office Action from corresponding Japanese Application No. 2016-545422, pp. 1-4, dated Feb. 6, 2018.

* cited by examiner

FIG. 1
(a)
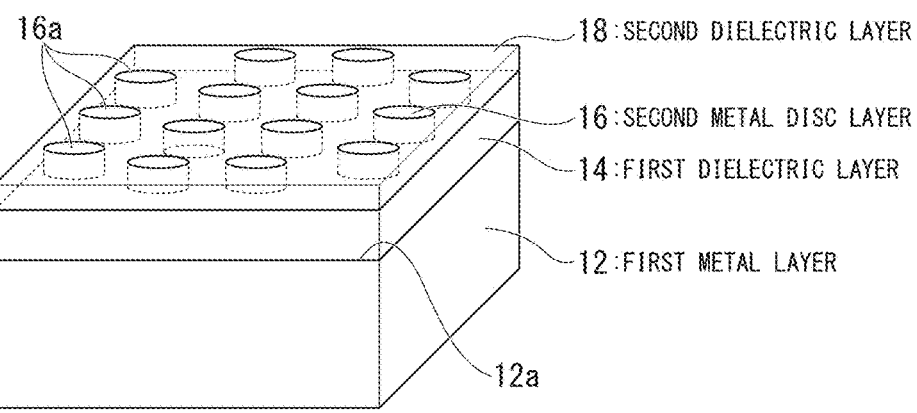
(b)
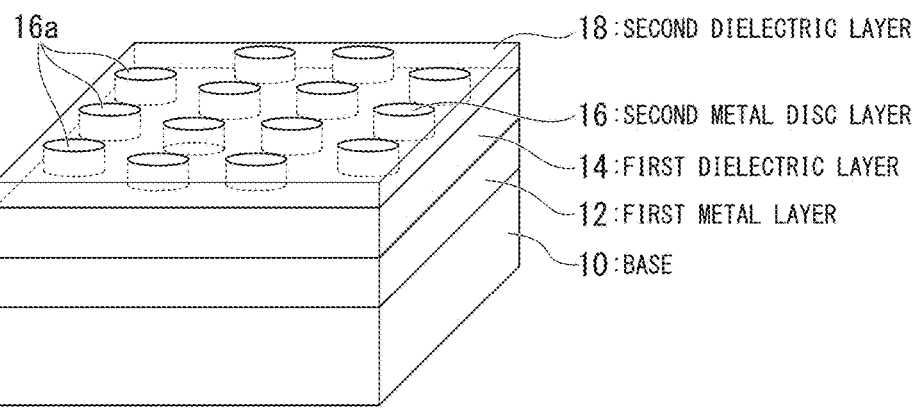

FIG. 5
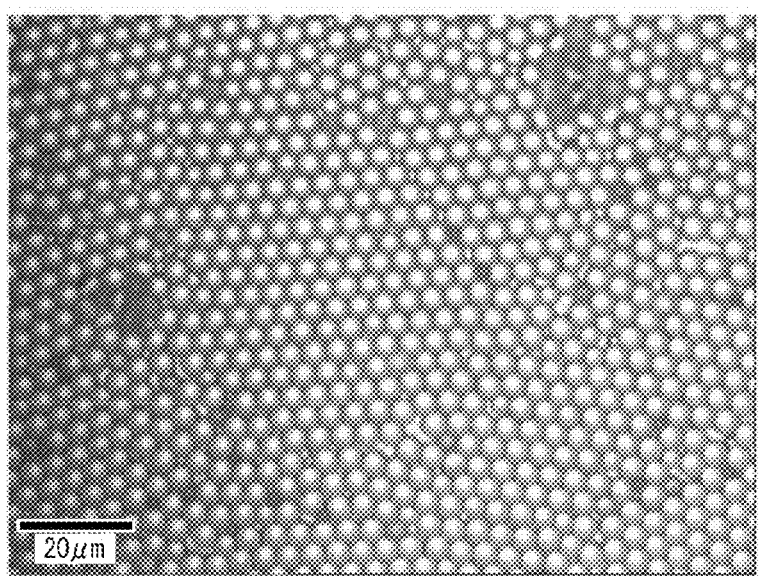
(a) TWO-DIMENSIONAL ARRANGEMENT OF POLYSTYRENE SPHERES
(DIAMETER OF 4.43 μm)
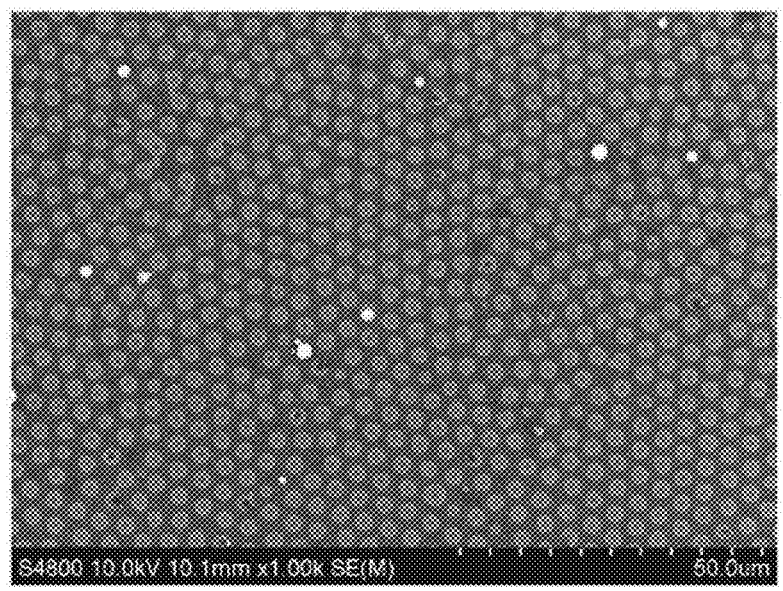
(b) TWO-DIMENSIONAL ARRANGEMENT OF MANUFACTURED Al DISCS

FIG. 6

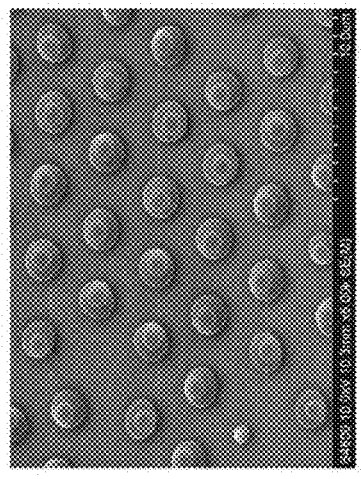

(a) TWO-DIMENSIONAL ARRANGEMENT OF Al DISCS MANUFACTURED USING POLYSTYRENE SPHERES WITH DIAMETER OF 4.42 μm

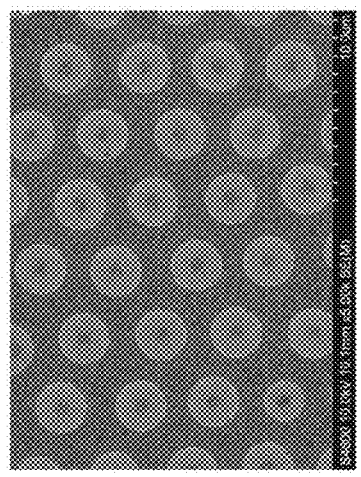

(b) TWO-DIMENSIONAL ARRANGEMENT OF TiN DISCS MANUFACTURED USING POLYSTYRENE SPHERES WITH DIAMETER OF 4.42 μm

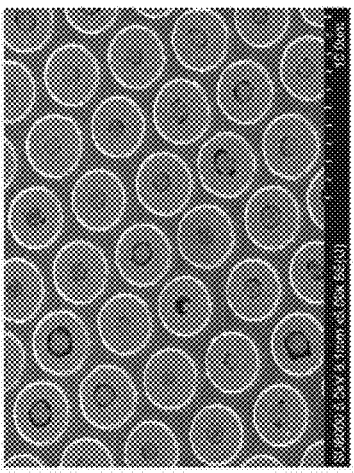

(c) TWO-DIMENSIONAL ARRANGEMENT OF TiN DISCS MANUFACTURED BY FURTHER PERFORMING REACTIVE ION ETCHING USING POLYSTYRENE SPHERES WITH A DIAMETER OF 4.42 μm TO DECREASE SIZE OF MASK

ELECTROMAGNETIC WAVE ABSORBING/RADIATING MATERIAL, METHOD OF MANUFACTURING SAME, AND INFRARED SOURCE

CROSS-REFERENCE TO RELATED APPLICATIONS

This application is a U.S. National Phase Application of International Application No. PCT/JP2015/072687 filed on Aug. 10, 2015 and asserts priority to Japanese Application No. 2014-176247 filed on Aug. 29, 2014, all of which are hereby incorporated by reference in their entirety.

TECHNICAL FIELD

The present invention relates to an electromagnetic wave absorbing/radiating material (light collecting/radiating material) which has a simple structure and is capable of selectively and efficiently absorbing or radiating electromagnetic waves at a desired wavelength in a range of ultraviolet light to far infrared light (hereinafter, simply referred to as electromagnetic waves in the present application). The present invention further relates to an infrared source using the material described above. The expression "electromagnetic wave absorbing/radiating" in this specification means that both absorbing and radiating can be essentially performed and does not exclude a material which is particularly suitable for one of them or a material which is substantially used or intended to be used only for specific one of the applications.

Priority is claimed on Japanese Patent Application No. 2014-176247, filed on Aug. 29, 2014, the content of which is incorporated herein by reference.

BACKGROUND ART

As a material efficiently absorbing infrared light or visible light in a broadband, black silicon using a blackened film using metal nanoparticles or carbon-based materials or black silicon using an array of needle-like silicon (PTL 1) is known in the conventional art. Light absorption in broadband over visible and infrared regions can be performed by using the elements described above. Meanwhile, a three-dimensional vertical microcavity structure or a line-and-space type resonator structure which performs treatment with respect to surfaces of precious metals or high-melting-point metals such as gold, tungsten, or nickel to cause confinement of surface plasmon in a surface vertical direction has been studied as a material exhibiting electromagnetic wave absorption in a narrowband, and visible-infrared light-absorbing materials having absorption properties in a narrowband have been developed (NPL 1). It is found that these materials can also be used as a light source of visible light or infrared light in a narrowband by being heated and the light source is operated as a visible light source or an infrared source capable of adjusting a radiation wavelength, by selecting dimensions of a cavity structure.

However, since the cavity structure of these is a three-dimensional structure, it is necessary to perform top-down processing methods causing a high cost such as focused ion beam processing, electron beam lithography, and nanoimprint methods for manufacturing the structure. When a step of performing vapor deposition with respect to metals using sputter deposition, vacuum deposition or the like is used, there are restrictions so that manufacturing accuracies of a depth direction and a transverse direction or a surface shape of a cavity structure are not obtained. In addition, even when a wall surface orthogonal to the surface is intended to be formed when forming holes or grooves, an unintended tapered inclination may be generated, in many cases. Such a problem causes a problem of not achieving properties of absorbing and radiating efficiency as design. In addition, since the processing methods described above may be not suitable for large area processing, there are also restrictions in applicable fields of these type of materials manufactured using the conventional art. As described above, it is required to simplify a complicated manufacturing step, decrease a cost thereof, and improve manufacturing accuracies and properties.

Further, tungsten, gold, or nickel, which are precious metals or heavy metals, causes a high cost and a great weight. Therefore, it is also required to provide a material having a new structure capable of being manufactured even when light and inexpensive materials having high suitability for mass production which can be easily manufactured as a product are used.

It is possible to manufacture a material which efficiently absorbs light and electromagnetic waves at a wavelength close to a specific wavelength using a precious metal-dielectric-precious metal laminated type metamaterial structure. Such electromagnetic wave-absorbing material can be applied for realizing high efficiency of a high-sensitive hydrogen sensor, a carbon dioxide sensor, or a solar cell. However, in the conventional art, only materials obtained by using a lithography process with a focused ion beam or an electron beam, or nanoimprinting which is a process which causes high cost and takes a long time, using precious metals such as gold or silver, have been realized (NPLs 2 to 5).

In addition, since metals having a comparatively low melting point such as gold, silver, or aluminum were used in electromagnetic wave absorbing/radiating materials of the conventional art, the materials have poor heat resistance and did not withstand the usage at a high temperature. According to Planck's law, as a temperature of an object increases, an intensity of heat radiation increases. Accordingly, particularly, in a case of aiming at providing a radiating material, it is necessary to heat the material to a higher temperature, in order to obtain a greater radiation intensity, and thus, it is required to obtain higher heat resistance.

CITATION LIST

Patent Literature

[PTL 1] U.S. Pat. No. 7,390,689

Non-Patent Literature

[NPL 1] Appl. Phys. Lett. 92, 021117 (2008), JOSA A, Vol. 18, Issue 7, pp. 1471-1476 (2001)
[NPL 2] K. Aydin, V. E. Ferry, R. M. Briggs, and H. A. Atwater, "Broadband polarization-independent resonant light absorption using ultrathin plasmonic super absorbers," Nat Commun 2, 517 (2011)
[NPL 3] Kai Chen, Ronen Adato, and Hatice Altug, ACS Nano, 2012, 6(9), pp 7998-8006
[NPL 4] D. Nau, A. Seidel, R. B. Orzekowsky, S.-H. Lee, S. Deb, and H. Giessen, Optics Letters, Vol. 35, Issue 18, pp. 3150-3152 (2010)
[NPL 5] Hideki Miyazaki, Takeshi Kasaya, Masanobu Iwanaga, Bongseok Choi, Yoshimasa Sugimoto, Kazuaki Sakoda, The 61st JSAP Spring Meeting, 17p-F12-13

[NPL 6] L. Isa, K. Kumar, M. Mueller, J. Grolig, M. Textor and E Reimhult, ACS Nano, 4(10), pp. 5665-5670, 2010

[NPL 7] G G Fuentes, J. Appl. Phys. 90, 2737 (2001)

SUMMARY OF INVENTION

Technical Problem

An object of the present invention is to provide an electromagnetic wave absorbing/radiating material having high wavelength selectivity, based on a simple and easily-manufacturable structure capable of being realized in combination of two-dimensional and isotropic structures, instead of an essentially three-dimensional structure such as a cavity structure used in the conventional art described above. Another object of the present invention is to provide a narrowband infrared source which has an easily-manufacturable structure, is easily increased in size, and easily performs control.

Solution to Problem

According to a first aspect of the present invention, an electromagnetic wave absorbing/radiating material is provided that includes: a conductor; and a plurality of conductor discs which are disposed in an array above a surface of the conductor.

Here, the conductor discs may be disposed in an array on a surface of a dielectric layer provided on the surface of the conductor.

According to a second aspect of the present invention, an electromagnetic wave absorbing/radiating material is provided that includes: a conductor; and a perforated conductor layer with a plurality of holes defined in an array disposed above a surface of the conductor.

In the electromagnetic wave absorbing/radiating material according to the second aspect, the perforated conductor layer may be disposed on a surface of a dielectric layer provided on the surface of the conductor.

In the electromagnetic wave absorbing/radiating material according to the first and second aspects of the present invention, the surface of the conductor may be a surface of a conductor layer which is conductor foil or a conductor film formed on a base.

The plurality of conductor discs or the plurality of holes may have the same size.

The plurality of conductor discs or the plurality of holes may be circular.

At least one of the conductor discs or the perforated conductor layer, and the surface of the conductor may consist of a light metal such as Al or Ti.

At least one of the conductor discs or the perforated conductor layer, and the surface of the conductor may consist of a heat resistant material such as Mo, W, Nb, Ta, Re, $MoSi_2$, TiN, ZrN, HfN, TiC, TaC, $LaB_6$, or $AlB_2$.

According to a third aspect of the present invention, a method of manufacturing an electromagnetic wave absorbing/radiating material is provided that includes the steps of: forming a dielectric layer on a surface of a first conductor; forming a second conductor layer on the dielectric layer; disposing a plurality of spheres in a single-layered array on a surface of the second conductor layer; etching the second conductor layer using the plurality of spheres as a mask to leave the second conductor layer immediately under the plurality of spheres as a plurality of conductor discs; and removing the plurality of spheres.

Here, the method may further include a step of uniformly decreasing sizes of the plurality of spheres before the step of etching the second conductor layer.

According to a fourth aspect of the present invention, a method of manufacturing an electromagnetic wave absorbing/radiating material is provided that includes the steps of: forming a dielectric layer on a surface of a first conductor; disposing a plurality of spheres in a single-layered array on a surface of the dielectric layer; depositing a conductor on the surface of the dielectric layer using the plurality of spheres as a mask to form a perforated conductor layer immediately under the plurality of spheres; and removing the plurality of spheres.

Here, the method may further include a step of uniformly decreasing sizes of the plurality of spheres before the step of depositing the second conductor layer.

In the method of manufacturing according to the third and fourth aspects of the present invention, the step of uniformly decreasing sizes of the plurality of spheres may be performed by means of reactive etching.

The step of disposing the plurality of spheres in a single-layered array on the surface of the second conductor layer or the dielectric layer may be performed by floating the plurality of spheres on a surface of liquid and transferring the spheres to the surface of the second conductor layer or the dielectric layer.

The plurality of spheres may be polystyrene spheres.

The plurality of spheres may have the same size.

At least one of the conductor discs or the perforated conductor layer, and the surface of the conductor may consist of a light metal such as Al or Ti.

At least one of the conductor discs or the perforated conductor layer, and the surface of the conductor may consist of a heat resistant material such as Mo, W, Nb, Ta, Re, $MoSi_2$, TiN, ZrN, HfN, TiC, TaC, $LaB_6$, or $AlB_2$.

According to a fifth aspect of the present invention, an infrared source is provided that uses the electromagnetic wave absorbing/radiating material according to the first aspect or the second aspect.

Advantageous Effects of Invention

According to the present invention, it is possible to provide an electromagnetic wave absorbing/radiating material having wavelength selectivity, while having a structure which is simple and easily manufacturable. The electromagnetic wave absorbing/radiating material of the present invention can easily realize high mechanical strength and high heat resistance from the structure thereof. According to the present invention, it is possible to provide a narrowband infrared source which can simply adjust radiation intensity in a wide range, without substantially changing radiation spectra, while having a scalable structure which is simple and easily manufacturable.

BRIEF DESCRIPTION OF DRAWINGS

FIG. 1(a) is a conceptual diagram showing an example of an electromagnetic wave absorbing/radiating material having a disc array structure obtained by processing a surface of a metal base to have a disc structure. FIG. 1(b) is a conceptual diagram showing a structure of an electromagnetic wave absorbing/radiating material having a disc array structure in which a metal disc arrangement-dielectric layer-metal layer are provided, in this order from the top, on a surface of a dielectric base. Both of the electromagnetic wave absorbing/radiating materials properly function without a second dielectric layer as an outermost layer.

FIG. 5(a) is a scanning electron microscope image of polystyrene spheres (diameter of 4.43 μm) two-dimensionally arrayed (arrayed in a single layer) which becomes a mask in a case where wet colloidal lithography is used. FIG. 5(b) is a scanning electron microscope image of a two-dimensional arrangement of Al discs which is a second metal layer manufactured in a case where wet colloidal lithography is used.

FIG. 6(a) is a scanning electron microscope image showing a two-dimensional arrangement of Al discs which is manufactured using polystyrene spheres having a diameter of 4.42 μm. FIG. 6(b) is a scanning electron microscope image showing a two-dimensional arrangement of TiN discs which is manufactured by etching polystyrene spheres having a diameter of 4.42 μm using reactive ion etching and then using the polystyrene spheres as a mask for TiN etching. FIG. 6(c) is a scanning electron microscope image showing a two-dimensional arrangement of TiN discs which is manufactured by etching polystyrene spheres having a diameter of 4.42 μm using reactive ion etching and then using the polystyrene spheres as a mask for TiN etching, in which the etching was performed so as to have a smaller size of a mask.

DESCRIPTION OF EMBODIMENTS

Figure 2:
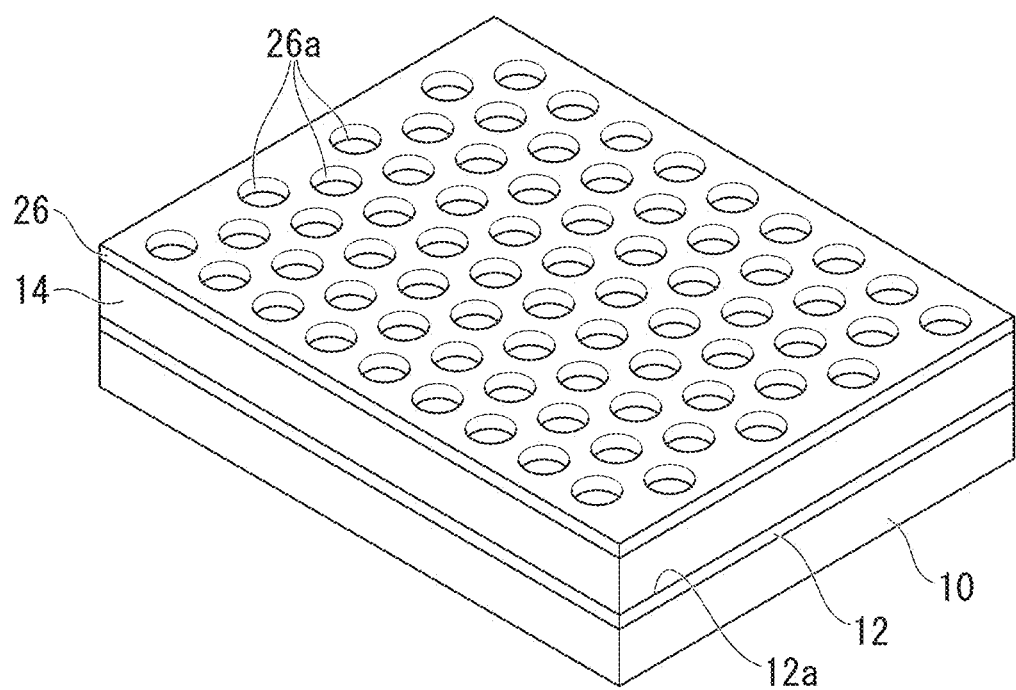
FIG. 2 is a conceptual diagram showing an example of an electromagnetic wave absorbing/radiating material having a hole array structure having a laminated structure of a conductor layer having an arrangement of holes-(perforated conductor layer)-dielectric layer-surface of a conductor, in this order from the top.

One embodiment of the present invention relates to a light and low-cost electromagnetic wave absorbing/radiating material having a laminated two-dimensional structure with a large area, in which a conductor and a dielectric thin film are laminated on each other, and which can selectively and efficiently absorb light at a predetermined wavelength from a ultraviolet range to far infrared range to convert the electromagnetic wave energy thereof into electric energy, thermal energy, and chemical energy, and can efficiently perform infrared radiation through heating or the like. The embodiment also relates to a method of manufacturing them.

The laminated two-dimensional structure here is specifically a structure in which a plurality of conductor discs are arranged to be disposed above a conductor surface, as shown in FIG. 1. A conductor surface 12a is used as a surface of a conductor (shown as a first metal layer in FIG. 1) 12. As shown in FIG. 1(a), a foil of a conductor such as metal is used as the first metal layer 12, and as shown in FIG. 1(b), the first metal layer 12 can be formed by forming a conductor layer (first metal layer 12) on a base (substrate or the like) 10. It is not necessary that the layer 12 shown as the "first metal layer" in FIG. 1 be formed of metal, and various conductors other than metal can be used, and accordingly, hereinafter, the layer is also referred to as a "first conductive layer" as necessary. A "metal disc" and a "metal disc layer" which will be described later are also referred to as a "conductor disc" or a "conductor disc layer" as necessary, in the same manner as described above. A thickness of the first conductive layer 12 may be approximately 10 nm to 1 mm. When the thickness thereof is equal to or greater than 10 nm, as the thickness increases, responsiveness increases. In a case of forming the first conductive layer using vapor deposition, a thickness which can be formed using vapor deposition may be set as an upper limit value, and approximately 200 nm is reasonable from viewpoints of time and cost. In a case of not performing vapor deposition, a pure flat metal base may be used. The thickness of the first conductive layer 12 is preferably 50 nm to 300 nm, but there is no limitation.

FIG. 1 shows a region where a plurality of conductor discs 16a are arranged, as a second metal disc layer 16. A thickness of the conductor disc 16a may be approximately 10 nm to 10 μm. Due to the same reason in the case of the first conductive layer, the thickness of the conductor disc 16a is preferably 50 nm to 300 nm, but there is no limitation. In order to perform the arrangement by separating the conductor surface 12a and the plurality of conductor discs 16a from each other, a dielectric layer (first dielectric layer) 14 is formed on the conductor surface 12a, and the conductor discs 16a can be arranged thereon.

In addition, a second dielectric layer 18 for protection may be formed on the conductor discs 16a. A thickness of the second dielectric layer 18 may be approximately 1 nm to 1 μm. In a case where the protection or the like is not necessary, or in a case where treatment for protection of metal discs is also performed at the same time when manufacturing another product by combining the electromagnetic wave absorbing/radiating material manufactured as described above and other members with each other, the second dielectric layer 18 may be omitted.

Here, when the conductor discs 16a are set to have a circular shape, electromagnetic wave absorption properties not affected by polarization directions of incident electromagnetic waves are realized. In addition, when these discs 16a are set to have the same size, fine wavelength selectivity can be obtained. A disc size (diameter of the conductor discs 16a) is preferably in a range of 0.01 µm to 100 µm and more preferably 0.5 to 20 µm. Particularly, in a case of performing the manufacturing using dry etching, the manufacturing is easily performed, when the diameter of the conductor discs 16a is 0.5 to 20 µm. The diameter of the conductor discs 16a is not limited to this range. Here, the diameter of the discs 16a is in the order approximately lower than half of a resonance wavelength, so as to generate stationary waves of plasmon, and strong electromagnetic wave absorption occurs at this wavelength. Accordingly, it is possible to expect an approximate value of a necessary diameter of the discs 16a from a desired absorption wavelength. A gap between the lower surface of the conductor discs 16a and the conductor surface 12a is preferably set as a greater value among a value which is approximately equal to or greater than the thickness of the discs 16a and a value which is equal to or greater than 1/10 of the diameter of the discs 16a. This gap is preferably set as a distance so that density of the discs does not become extremely small and electromagnetic interaction between the discs does not become significantly great. Specifically, the space thereof is preferably equal to or smaller than the diameter of the discs 16a and more preferably equal to or greater than 0.1 µm and equal to or smaller than the diameter of the discs 16a, but there is no limitation.

Figure 8A:
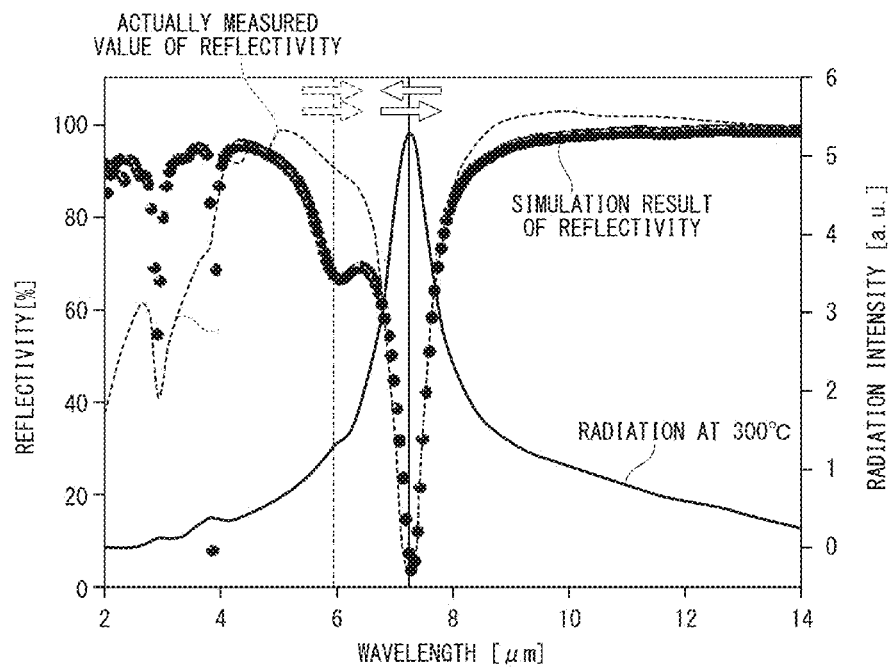
FIG. 8A is a view showing reflection and radiation spectra of an electromagnetic wave absorbing/radiating material having a disc array structure manufactured by using Al in a metal layer and an alumina in a dielectric layer.

As shown with electron microscope images of FIG. 5(b) and FIG. 6, it is not necessary that the plurality of conductor discs 16a be arranged completely regularly as lattice points (for example, lattice points of close-packed hexagonal lattice formed in a case where monodisperse spheres are densely filled, which will be described later). Randomness of the arrangement, that is, slight deviation from the arrangement of the lattice points is rather preferable in many cases. In this case, an extra peak of absorption wavelength properties due to the regular arrangement can be prevented (compare shapes of a graph of a simulation result and a graph of actually measured value in FIG. 8A at wavelengths around 4 µm and around 5.9 µm. In FIG. 8A, the graph of the simulation result regarding the electromagnetic wave absorbing/radiating material in which the conductor discs 16a are arranged on the lattice points of the close-packed hexagonal lattice shows great dips at wavelengths around 4 µm and around 5.9 µm, compared to the graph of the actually measured value regarding the electromagnetic wave absorbing/radiating material in which the conductor discs 16a are arranged to be deviated from the lattice points). The plurality of conductor discs 16a are arranged so that a distance between centers (period) of adjacent discs is preferably approximately double to approximately 1.1 times the diameter of the disc 16a and more preferably approximately 1.5 times to approximately 1.1 times the diameter of the disc 16a, and the conductor discs are arranged so that an occupancy rate of discs with respect to the total surface area is approximately 0.5 to 0.8, but there is no limitation.

The material (raw material) of the first metal layer 12 and the conductor discs 16a is not limited to precious metals such as Au, which is often seen in a typical device using plasmon. Light metals (Al, Ti, and the like), other various base metals (Fe, Cu, and the like), alloys thereof, and other conductive compounds (metal carbide, oxide, nitride, boride, and the like having conductivity such as TiC, TaC, RuO) can be used. In addition, a highly heat resistant material such as Mo, W, Nb, Ta, Re, $MoSi_2$, TiN, ZrN, HfN, TiC, TaC, $LaB_6$, or $AlB_2$ can also be used. Further, the same conductive material may be used or different materials may be used for the first metal layer 12 and the second metal disc layer 16.

Materials (raw materials) of the first and second dielectric layers 14 and 18 are not limited either, and an oxide insulator such as $SiO_2$, $Al_2O_3$, an nitride insulator such as $Si_3N_4$, a boride insulator such as BN, a metal halide insulator such as $MgF_2$ or $CaF_2$, or an insulating polymer can be used. Regarding the materials of the dielectric layers 14 and 18, respective materials used independently from each other can be selected according to the necessary performance or manufacturing process.

The laminated two-dimensional structure according to the present embodiment is not limited to the structure in which the conductor discs 16a are disposed above, or apart from the metal layer (conductor layer) 12 as shown in FIG. 1. A conductor layer (perforated conductor layer) 26 having a shape complementary to the arrangement of the conductor discs 16a, that is, a shape in which a plurality of holes 26a are arranged as shown in FIG. 2, may be used instead of the arrangement of the conductor discs 16a. In this specification, the structure in which the conductor discs are arranged as shown in FIG. 1 is referred to as a "disc array structure" and the structure having a metal layer in which holes are arranged as shown in FIG. 2 is referred to as a "hole array structure".

The hole array structure shown in FIG. 2 has the same configuration as that of the disc array structure of FIG. 1, except that the conductor layer 26 in which, not the plurality of conductor discs, but the plurality of holes 26a are arranged is formed on the first dielectric layer 14. Here, as described above regarding the disc array structure, in a case where the term "metal" is shown as a material (raw material) like a "metal layer", this layer may be configured with a conductor other than metal.

A thickness of the conductor layer 12 for providing the conductor surface 12a may be approximately 10 nm to 1 mm. The thickness thereof is preferably 50 to 200 nm, but there is no limitation. A thickness of the conductor layer (second metal layer) 26 in which the holes 26a are arranged may be approximately 10 nm to 10 µm. The thickness thereof is preferably 50 to 200 nm, but there is no limitation. The plurality of holes 26a penetrate through the conductor layer 26. Here, in the same manner as in the case of the disc array structure, the diameter of the holes 26a is in the order approximately lower than half of a resonance wavelength of generated plasmon resonance, and strong electromagnetic wave absorption occurs at this wavelength. Accordingly, also in the case of the hole array structure, it is possible to expect an approximate value of a necessary diameter of the holes 26a from a desired absorption wavelength. In order to perform the arrangement by separating the conductor surface 12a and the conductor layer 26 in which the holes 26a are arranged from each other, the dielectric layer (first dielectric layer) 14 is formed on the conductor surface 12a, and the conductor layer 26 in which the holes 26a are arranged can be provided thereon. Further, in the same manner as in the disc array structure of FIGS. 1A and 1B, a second dielectric layer for protection (not shown) may be formed on the conductor layer 26 in which the holes 26a are arranged. A thickness of the second dielectric layer may be approximately 1 nm to 1 μm. In a case where the protection or the like is not necessary, or in a case where treatment for protection of conductor layers 26 in which the holes 26a are arranged is also performed at the same time when manufacturing another product by combining the electromagnetic wave absorbing/radiating material manufactured as described above with other members or the like, the second dielectric layer may not be provided.

Materials (raw materials) of the first and second dielectric layers are not limited either, and in the same manner as in the disc array structure, an oxide insulator such as $SiO_2$, $Al_2O_3$, an nitride insulator such as $Si_3N_4$, a boride insulator such as BN, a metal halide insulator such as $MgF_2$ or $CaF_2$, or an insulating polymer can be used. Regarding the materials of the dielectric layers, respective materials used independently from each other can be selected according to the necessary performance or manufacturing process.

In the same manner as in the disc array structure, the material (raw material) of the conductor layer 12 provided with the conductor surface 12a and the conductor layer 26 in which the holes 26a are arranged is not limited to precious metals such as Au, which is often seen in a typical device using plasmon. Light metals (Al, Ti, and the like), other various base metals (Fe, Cu, and the like), alloys thereof, and other conductive compounds (metal carbide, oxide, nitride, boride, and the like having conductivity such as TiC, TaC, RuO) can be used. In addition, a highly heat resistant material such as Mo, W, Nb, Ta, Re, $MoSi_2$, TiN, ZrN, HfN, TiC, TaC, $LaB_6$, $AlB_2$ can also be used. Further, the same conductive material may be used or different materials may be used for both conductor layers.

When the holes 26a are set to have a circular shape, electromagnetic wave absorption properties not affected by polarization directions of incident electromagnetic waves are realized. In addition, when the holes 26a are set to have the same size, fine wavelength selectivity can be obtained. A size (diameter) of the holes 26a is preferably in a range of 0.01 μm to 100 μm and more preferably 0.5 to 20 μm, but there is no limitation. A gap between the lower surface of the conductor layer 26 in which the holes 26a are arranged and the conductor surface 12a is preferably set as a greater value among a value which is approximately equal to or greater than the thickness of the conductor layer 26 and a value which is equal to or greater than 1/10 of the diameter of the holes 26a. This gap is preferably equal to or smaller than 1 μm and more preferably equal to or greater than 0.1 μm and equal to or smaller than 1 μm, but there is no limitation.

In the electromagnetic wave absorbing/radiating material having the hole array structure, a resonance mode at a short wavelength tends to be dependent mainly on the period of the holes (holes 26a) (that is, interval between the holes 26a which are periodically arranged) and the thickness of the dielectric layer 14, and a resonance mode at a long wavelength tends to be dependent mainly on the size of the holes 26a. When such structures are suitably adjusted, it is possible to realize a resonance frequency and the number of mods according to the purpose. In the hole array structure, an element which was configured with the plurality of conductor discs 16a in a case of the disc array structure can be configured with one conductor layer 26. Accordingly, when it is necessary to perform the electric connection with respect to this part (second metal layer 16 or 26), the realization thereof is easily achieved. The plurality of holes 26a are arranged so that a distance between centers of the adjacent holes is preferably 0.5 to 20 μm and more preferably 1.0 to 15.0 μm, and the holes are arranged so that an occupancy rate of holes with respect to the total surface area is approximately 0.3 to 0.7, but there is no limitation.

As in the case of the disc array structure, the holes 26a may be provided with randomness of the arrangement, that is, to be slightly deviated from the arrangement of the lattice points, without being completely regularly arranged as lattice points (for example, lattice points of close-packed hexagonal lattice). However, unlike in the disc array structure, in a case of the hole array structure, the effect of the irregularity appears in both of two mods at a long wavelength and a short wavelength. That is, when the periodicity of the arrangement of the holes 26a is not obtained in the hole array structure, a dip or peak shape becomes broad over the entire spectra, and a depth of the dip or a height of the peak is decreased. In the disc array structure, the effect of the irregularity does not substantially appear at a long wave mode side, and the broadened shape and a decrease in depth or height described above appear at a short wavelength mode side.

The electromagnetic wave absorbing/radiating material according to the present embodiment having a disc array structure can be manufactured as described below.

In a first method, colloidal lithography (NPL 6), which is a method of transferring monolayer polystyrene spheres (reference numeral B of FIG. 3) floated on a surface of an aqueous solution to a structure of metal-dielectric-metal, is used. Accordingly, it is possible to simply and rapidly manufacture a disc array structure for a large-area device at low cost by using polystyrene spheres as a mask.

Figure 3:
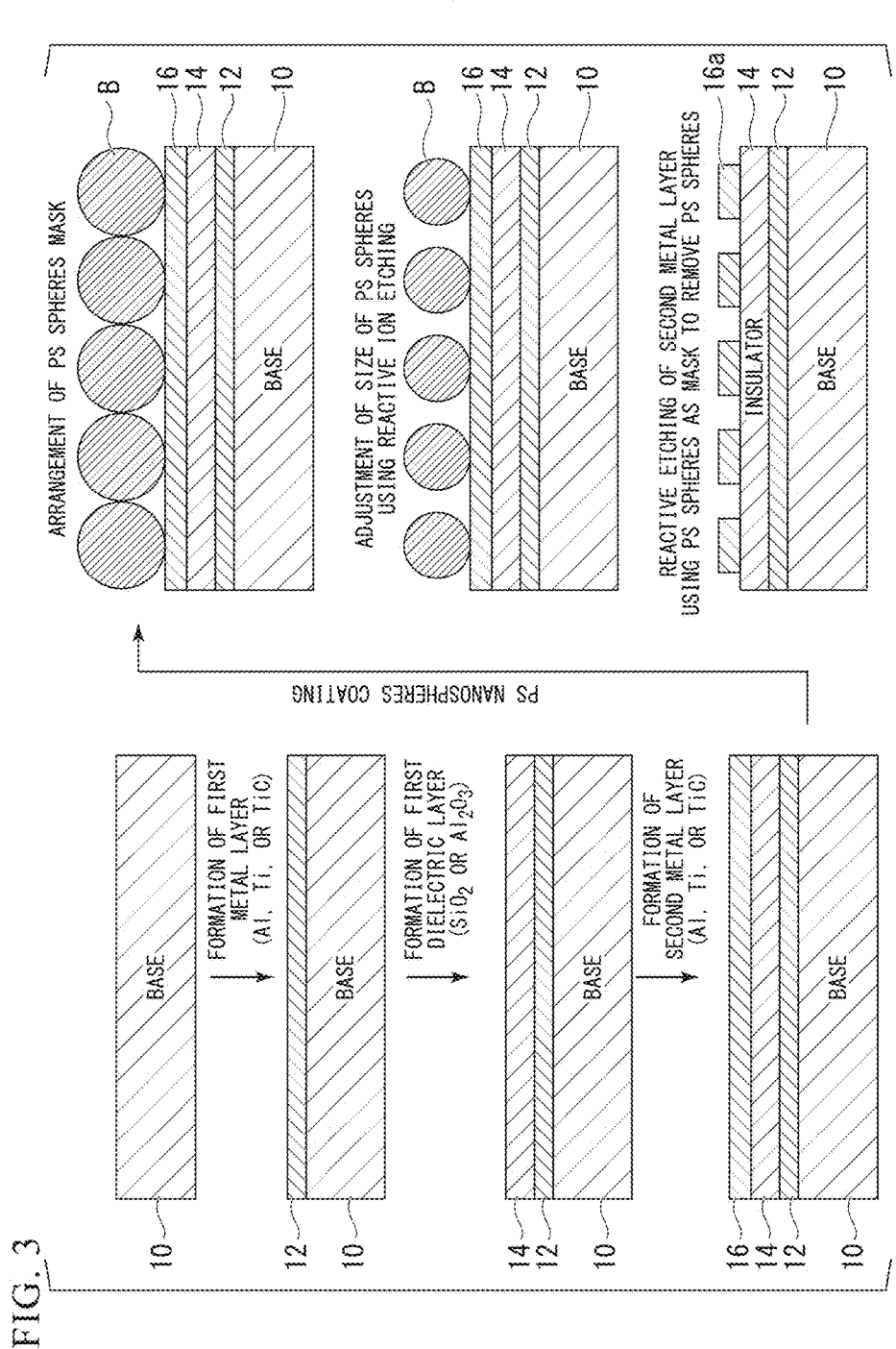
FIG. 3 is a view showing an example of a method of manufacturing an electromagnetic wave absorbing/radiating material having a disc array structure obtained by using wet colloidal lithography.

Specifically, as shown in FIG. 3, first, the first metal layer (first conductor) 12 is formed on the base 10 such as a substrate by using a physical deposition method such as a sputtering method, a vacuum deposition method, or a pulse laser deposition method, or a wet method obtained by combining spin coating and a sol-gel method with each other, and the first dielectric layer 14 and the second metal layer (second metal disc layer and second conductor layer) 16 are formed thereon in this order. The PS spheres (polystyrene spheres) B with a uniform size in a single layer floated on a surface of an aqueous solution are transferred thereon. Accordingly, two-dimensional PS sphere arrangement, that is, PS sphere arrangement obtained by transferring the PS spheres B arrayed in a single layer so that the PS spheres B are not overlapped with each other, is obtained on the second metal layer 16. After that, a size (diameter) of the PS spheres B is adjusted (uniformly decreased) by reactive ion etching (reactive etching). Then, the reactive etching of the second metal layer 16 is performed using the PS spheres B as a mask, the conductive discs 16a with a uniform size remain immediately below the PS spheres B. By removing the PS spheres B, an electromagnetic wave absorbing/radiating material is obtained. The second dielectric layer 18 may be formed thereon as necessary.

FIG. 5(a) is a scanning electron microscope image of the polystyrene spheres B having a diameter of 4.43 μm which are two-dimensionally arrayed (arrayed in a single layer) on the second metal layer 16 in the wet colloidal lithography described above. FIG. 5(b) is a scanning electron microscope image of the conductor discs (Al discs) 16a formed of Al which are formed by using the polystyrene spheres B of FIG. 5(a) as a mask. FIGS. 6(a) to 6(c) are scanning electron microscope images of the conductor discs 16a formed by using the wet colloidal lithography described above, by using the polystyrene spheres B having a diameter of 4.42 μm as a mask. The conductor discs 16a are formed of Al in FIG. 6(a) and TiN in FIGS. 6(b) and 6(c). FIG. 6(c) shows conductor discs obtained by increasing a reductive quantity of the diameter of the polystyrene spheres B in the reactive ion etching compared with that in FIG. 6(b). As shown in FIGS. 5 and 6, since the diameter of the conductor discs 16a is dependent on the diameter of the polystyrene spheres B used as a mask, the conditions of the reactive ion etching (reactive etching) for decreasing the diameter of the polystyrene spheres B may be adjusted according to the desired diameter of the conductor discs 16a.

It is also possible to essentially manufacture the hole array structure by the same method as that described above. The manufacturing procedure of this case will be specifically described below.

First, the first metal layer 12 and the dielectric layer (first dielectric layer) 14 are laminated on each other in this order by using a sputtering method. Here, in the same manner as in the case of manufacturing the disc array structure, a two-dimensional arrangement film of PS spheres B is formed by using a method of transferring PS spheres B with a uniform size in a single layer floated on a surface of an aqueous solution onto the dielectric layer 14. In the same manner as in the case of the disc array structure, the size of the PS spheres B is adjusted by the reactive ion etching. After that, the second metal layer 26 is formed by using an electron-beam deposition method. At this time, as a method of forming the second metal layer 26, an electron-beam deposition method is more preferable than a sputtering method. This is because, when performing the formation using a sputtering method, atoms have strong properties to go around the back of a mask, and therefore the effect of the PS sphere mask is decreased. After forming the second metal layer 26, the PS spheres B can be removed by performing ultrasonic cleaning in an organic solvent. By doing so, it is possible to obtain an electromagnetic wave absorbing/radiating material having a hole array structure with a large area, in the same manner as in the case of the disc array structure. Since the "first metal layer 12" and the "second metal layer 26" here can be manufactured by using exactly the same material (raw materials) as that described above in the case of the disc array structure, these may be generally referred to as a "first conductive layer" and a "second conductive layer".

In any case of the disc array structure and the hole array structure, it is possible to rapidly and simply manufacture the mask by using the method described above, without using a method such as electron beam lithography and focused ion beam processing. Regarding the PS spheres B, a commercially available product having high sphericity and small distribution of sizes (diameters) is used, and accordingly, conductor discs which are close to a perfect circle and have a uniform size (diameter) can be arranged on the first dielectric layer 14. Alternatively, the conductor layer 26 in which such holes 26a are arranged can be provided on the first dielectric layer 14. Therefore, according to this method, it is possible to easily manufacture an electromagnetic wave absorbing/radiating material with a narrowband and a large area.

Here, the PS spheres are used as a mask material, but materials other than PS can be used, as long as it is a material capable of being subjected to the same process.

Figure 4:
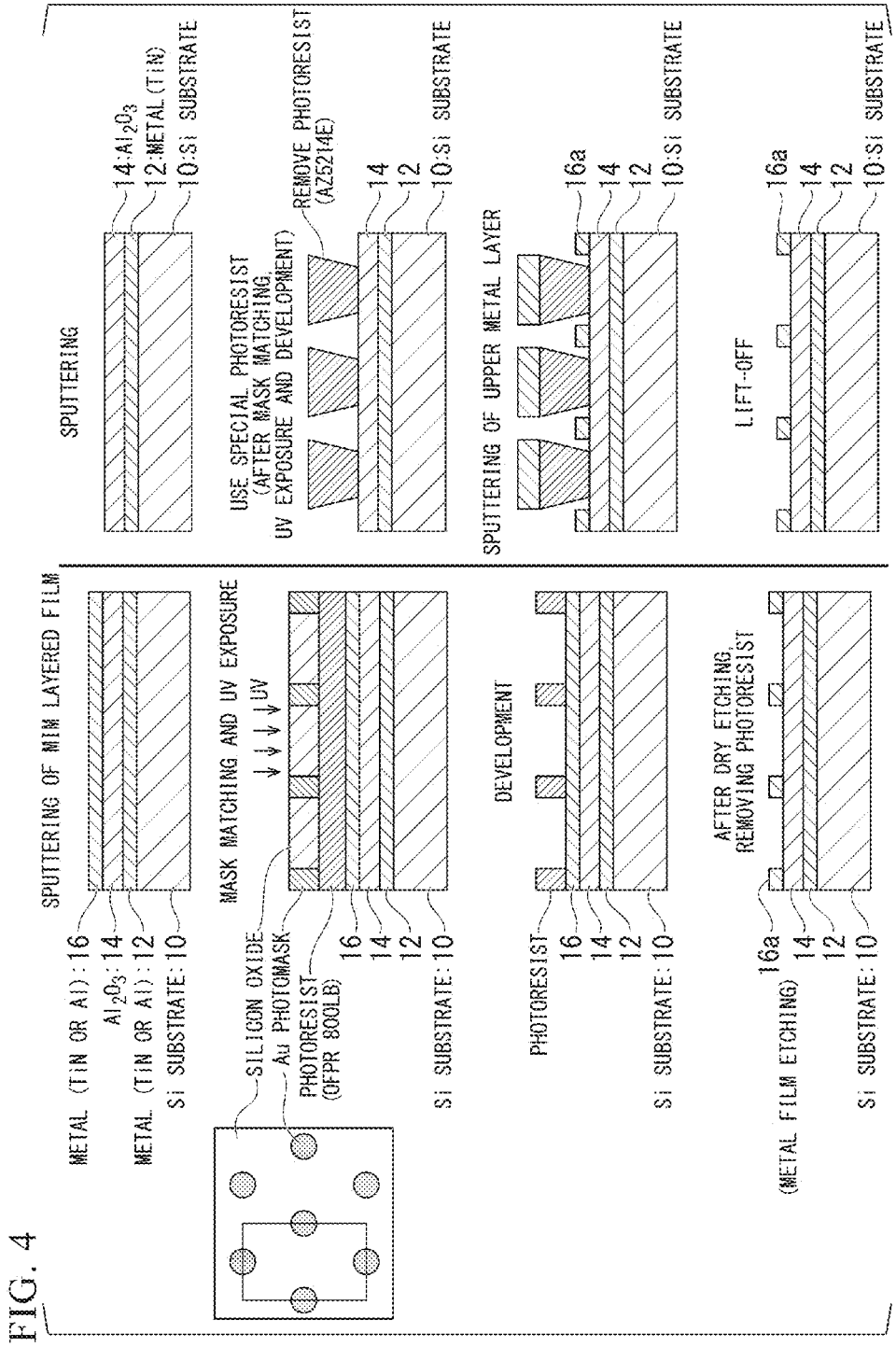
FIG. 4 is a view showing another example of a method of manufacturing an electromagnetic wave absorbing/radiating material having a disc array structure obtained by using photolithography.

In a case of a small area, it is possible to manufacture an electromagnetic wave absorbing/radiating material by manufacturing a mask using photolithography, without using electron beam lithography or focused ion beam processing, which requires a vacuum environment and takes time, in any case of the disc array structure and the hole array structure. A left diagram of FIG. 4 shows an example of a manufacturing process of the case of the disc array structure. The hole array structure can also be manufactured in the same manner. It is also possible to form the arrangement of the conductor discs 16a or the conductor layer 26 in which the holes 26a are arranged by using a lift-off process shown in the right diagram of FIG. 4, without using etching shown in the left diagram of FIG. 4. The process used in these methods is a well-known process in technical fields of semiconductor manufacturing, and therefore the specific description thereof is omitted.

According to the electromagnetic wave absorbing/radiating material of the present embodiment, a two-dimensional laminated structure including a conductor which may be light metal such as aluminum or an alloy thereof, as a constituent element, and capable of freely imparting light absorbing/radiating properties in a narrowband, is provided. The material of the conductor here is not limited to precious metal, rare metal, or heavy metal, and light metal, alloy thereof, or conductive metal nitride or metal boride can be used.

It is possible to simply and rapidly manufacture the electromagnetic wave absorbing/radiating material according to the present embodiment without using the process which uses a vacuum, causes high cost and takes a long time such as electron beam lithography or focused ion beam processing. Specifically, it is possible to manufacture the electromagnetic wave absorbing/radiating material according to the embodiment by using a colloid chemical self-organization method or a vacuum deposition method at low cost. The electromagnetic wave absorbing/radiating material of the present embodiment obtained as described above exhibits high-efficient electromagnetic wave-absorbing properties. In the present embodiment, since the disc array structure or the hole array structure having high accuracy can be manufactured at low cost in a short time, compared to the method in the conventional art, it is possible to manufacture an absorbing material (electromagnetic wave absorbing/radiating material) having high efficiency in a narrowband even in a large area equal to or greater than several cm or several tens of cm. Since the material of the present embodiment has the narrowband properties of absorbing infrared light or visible light only at a specific wavelength, the material can be applied to a wave-selection type detector with a high-sensitivity, a multiwavelength measurement type temperature sensor or a small spectroscope using the detector, or a hyper spectrum sensor. In addition, the material can be applied to a panel type electromagnetic wave radiating material which selectively radiates electromagnetic waves at a specific wavelength. Aluminum or light metal compounds can be used, and therefore, it is possible to realize an absorbing and radiating material (electromagnetic wave absorbing/radiating material) with a light weight.

According to the present embodiment, it is possible to realize an electromagnetic wave radiating material having high heat resistance capable of being operated at a high temperature (equal to or higher than approximately 800° C.). When the electromagnetic wave radiating material is operated at a high temperature, it is possible to increase radiation intensity, and as known from Planck's law of radiation, it is possible to efficiently radiate near infrared light at a shorter wavelength. In order to realize such an electromagnetic wave radiating material capable of being operated even at a high temperature, specifically, a high-melting-point metal material such as molybdenum, a metal nitride, a metal carbide, or a dielectric such as alumina or silicon nitride may be used, for example. Thereby, it is possible to obtain an electromagnetic wave radiating material of high heat resistance and high radiation intensity. The electromagnetic wave absorption may be performed under an environment at a high temperature depending on the purpose, and it is also possible to realize an electromagnetic wave-absorbing material used for such a purpose, in the same manner as described above. When the material is used at a high temperature, thermal expansion and constriction are repeated. Accordingly, for the electromagnetic wave absorbing/radiating material or a device using this, a combination of materials forming a metal-dielectric bonding which can maintain mechanical strength may be used, or an arbitrary shape or structure hardly receiving effects such as thermal deformation even at a high temperature can also be used.

Here, the radiated electromagnetic waves have a narrow band of spectra compared to electromagnetic waves radiated from a black body or from a high-temperature object similar thereto, and have a properties in which a center frequency and a shape of spectra substantially do not change even when a temperature is changed. Accordingly, in a case where the electromagnetic wave absorbing/radiating material of the present embodiment is used as an electromagnetic wave radiating material, it is possible to change only radiation intensity in a wide range, without substantially changing radiation spectra, by a simple operation of changing a temperature of the electromagnetic wave radiating material.

EXAMPLES

First Example

An electromagnetic wave absorbing/radiating material with a disc array structure was manufactured by the method of manufacturing using the wet mask based on PS spheres B described with reference to FIG. 3. Measurement results and simulation results regarding this electromagnetic wave absorbing/radiating material are shown below. In FIG. 7(a), aluminum, which is a light metal with low cost, was used as the material (raw material) of the first and second metal layers 12 and 16, and absorptivity which was substantially close to 100% was realized.

Figure 7:
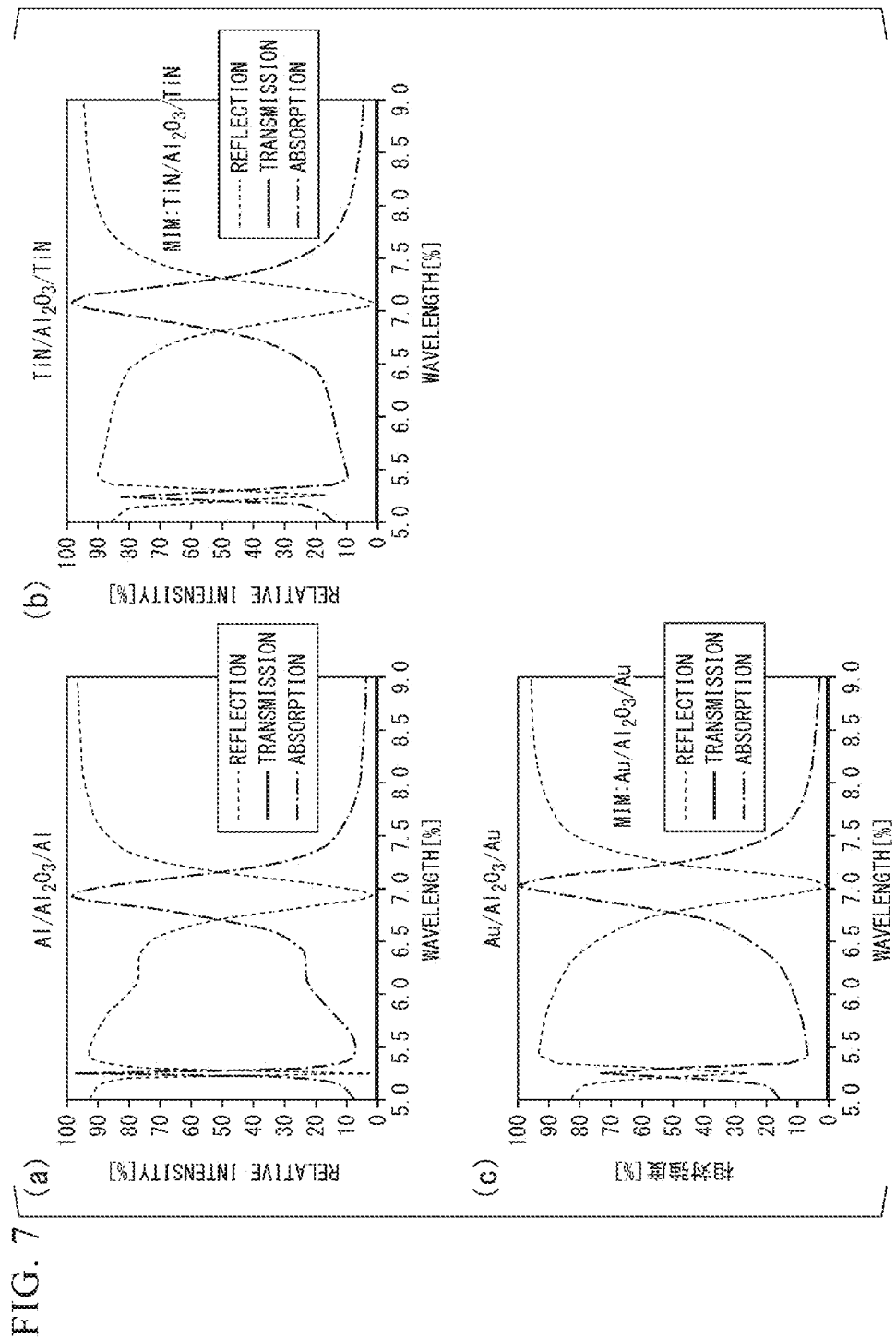
FIG. 7 is a view showing simulation spectra in cases where a material (raw material) of a conductor layer is changed as (a) Al, (b) Au, and (c) TiN, in a disc array structure. Even when the material is changed, each spectrum shows the same properties. Material properties of TiN are cited from NPL 7.
Figure 8B:
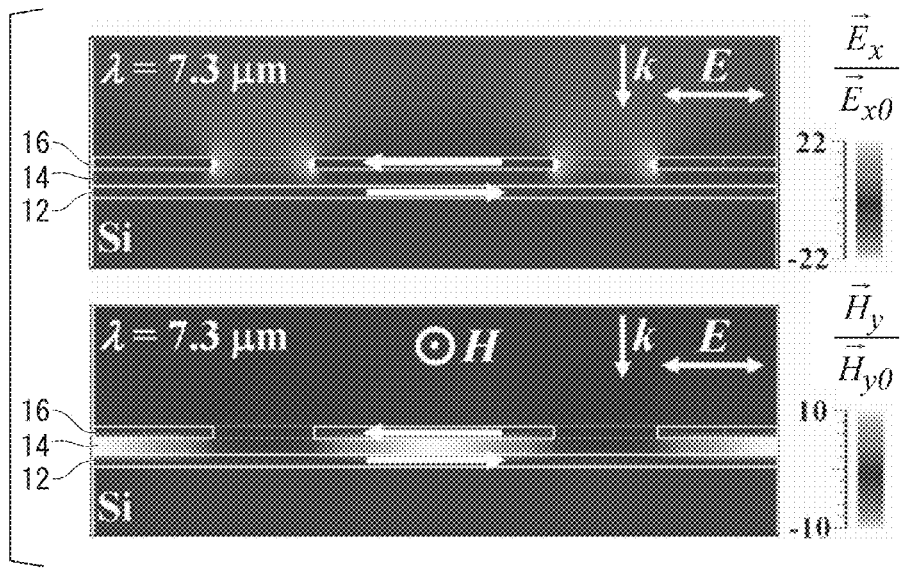
FIG. 8B is a view showing results of electromagnetic simulation regarding the same electromagnetic wave absorbing/radiating material used in FIG. 8A. The simulation was performed regarding reflection spectra.

FIGS. 7, 8A, and 8B show actually measured or simulated results of transmittance of light when the surface of the second metal layer 16 of the electromagnetic wave absorbing/radiating material is exposed to light.

FIG. 7 is simulation results showing relationships between relative intensity of reflected light, transmitted light, and absorbed light with respect to intensity of incident light, and wavelengths of the incident light, when the surface of the second metal layer 16 of the electromagnetic wave absorbing/radiating material was exposed to light. In the simulation, the electromagnetic wave absorbing/radiating material in which the thicknesses of the first metal layer 12, the first dielectric layer 14, and the second metal layer 16 were respectively 100 nm, 200 nm, and 100 nm was used. The diameter of the discs was set as 3 μm and the period (distance between centers of the discs) was set as 4.4 μm. The simulation was performed by setting the material of the first and second metal layers 12 and 16 as Al in FIG. 7(a), Au in FIG. 7(b), and TiN in FIG. 7(c), and the material of the first dielectric layer 14 as $Al_2O_3$ in all drawings. The simulation was performed by using a calculation method called an RCWA method. Since the thickness of the first metal layer 12 was large, relative intensity of transmitted light was zero, as shown in FIG. 7. Even when the material (raw material) of the conductor layers 12 and 16 was changed, the spectra showed the same properties.

When 0 is substituted for transmittance in a relational expression generally satisfied as [reflectivity]=1-[transmittance]-[absorptivity], a relational expression of [reflectivity]=1-[absorptivity] is obtained. In practice, in the electromagnetic simulation result which will be described later, the reflectivity and the absorptivity were inversed upside down. According to Kirchhoff's law, absorptivity and emissivity are equivalent to each other, and accordingly, high absorptivity means high emissivity. Therefore, the absorptivity close to 100% indicates that an electromagnetic wave radiating material having extremely high efficiency and emissivity extremely close to 1.0 can be formed. Thus, it is possible to obtain a panel-type material which can efficiently radiate electromagnetic waves at a desired wavelength by controlling the structure.

As shown in FIG. 7, the electromagnetic simulation showed that the same absorption properties were generated even with a combination of Al and Au (FIG. 7(b)). A simulation result indicating that it is possible to obtain equivalent properties even when TiN, which is a conductive ceramic material, is used was obtained (FIG. 7(c)). This shows that, even when gold or silver is not used, it is possible to manufacture an electromagnetic wave absorbing/radiating material having sufficiently high-performance electromagnetic wave absorption properties or electromagnetic wave radiating properties, by using a suitable material (raw material). Since TiN has high mechanical strength and a light weight and can be used even at a high temperature, TiN can be used as an electromagnetic wave radiating material which can efficiently absorb heat rays and efficiently radiate an energy thereof as electromagnetic waves at wavelengths of near infrared or middle infrared light in a narrowband.

[Electromagnetic Simulation]

Figure 10:
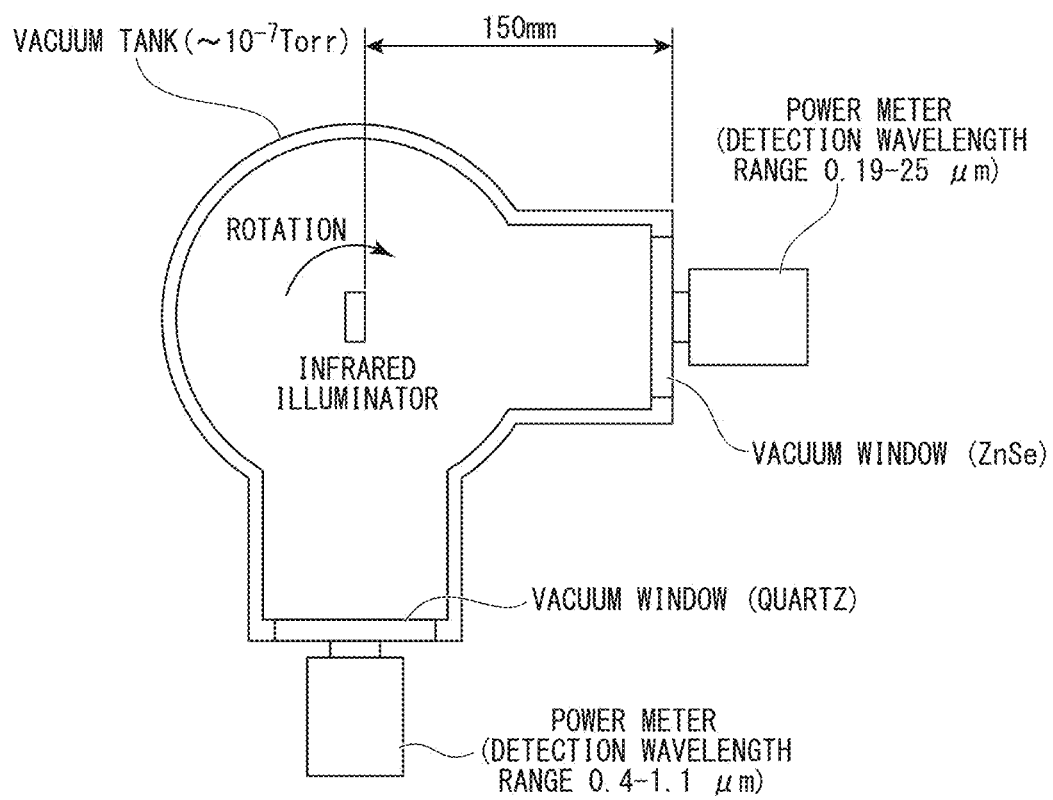
FIG. 10 is a view showing a conceptual configuration of a measurement device used in a second example.

FIGS. 8A and 8B show results of a real space electromagnetic-field distribution simulation using a Finite-difference time-domain method (FDTD method) and an electromagnetic simulation using a Rigorous coupled-wave analysis (RCWA) method. FIG. 8A shows actually measured values of reflectivity and measurement results of radiation intensity at 300° C. In the simulations and measurements, the electromagnetic wave absorbing/radiating material in which the thicknesses of the first metal layer 12, the first dielectric layer 14, and the second metal layer 16 were respectively 100 nm, 200 nm, and 100 nm was used. The diameter of the discs was set as 2.3 μm, the period (distance between centers of the discs) was set as 4.4 μm, the first and second conductor layers 12 and 16 were formed of aluminum, and the first dielectric layer 14 was formed of alumina. The simulation was performed by using the RCWA method. The measurement of reflectivity was performed by using infrared spectroscopy. The measurement of radiation intensity was performed by using a measurement device of FIG. 10 which will be described later. As shown in FIG. 8A, the calculation results and the actually measured values of reflection spectra showed a sharp decrease in reflection at a wavelength close to 7.3 μm and were substantially zero at a wavelength of 7.3 μm. When considering that the electromagnetic wave absorbing/radiating material does not cause the transmission of electromagnetic waves, as shown in FIG. 7, this shows that absorption of substantially 100% of electromagnetic waves occurs at this wavelength (absorption=1-reflection).

FIG. 8B shows distribution of electromagnetic fields at a wavelength of 7.3 μm. From the distribution of electromagnetic fields, a reason of such sharp and strong absorption properties is found. That is, in general, in a case where the electromagnetic field penetrates inside of metal from the vicinity of the surface thereof, energy loss occurs due to vibration of electrons in the metal material, resonance frequency is widened, and spectra becomes broad. Meanwhile, from a vibration mode of resonance at a wavelength of 7.3 µm of FIG. 8B, movements of electrons in the first metal layer 12 and the second metal layer 16 are opposite to each other (arrows on the first and second metal layers 12 and 16 of FIG. 8B). Accordingly, a magnetic field generated is in a mode of being confined in the first dielectric layer 14, rather than inside of the metal. At this time, a strong electrical field is generated in the first dielectric layer 14 which is directly under the second electrode layer 16 due to an effective loop current generated due to currents in reverse direction to each other generated in the first metal layer 12 and the second metal layer 16. Since an electromagnetic field input into a system of FIG. 8B has an alternating current, a strong magnetic field in the first dielectric layer 14 generated due to this electromagnetic field is also an AC magnetic field. This is considered that the energy of the electromagnetic field is away from the surface of the metal, and concentrated in the dielectric, so that the energy loss due to electron vibration in the metal is prevented, and thus a spectrum width getting narrower. From real space distribution of the electric field shown in FIG. 8B, it is found that a large electric field is generated to be concentrated on the edge of the disc structure. By using this electric field-enhancing effect, it is possible to expect the structure to be effective as the base of surface-enhanced infrared absorption or surface-enhanced Raman scattering. Here, in general, a mode in which strong electromagnetic field absorption occurs may be a case where electric polarization in opposite directions (generated due to charge transfer accompanied with plasmon vibration) occurs in the upper metal layer and the lower metal layer. Here, in a case where one of the upper and lower metal layers (second metal layer, in an example shown in FIG. 8B) has the disc array structure, the one layer is conductor discs, as immediately understood from the description regarding space distribution of the magnetic field of FIG. 8B. With respect to this, it is also clear that, in a case of the hole array structure, one of the upper and lower metal layers is a conductor present between adjacent holes.

Figure 9:
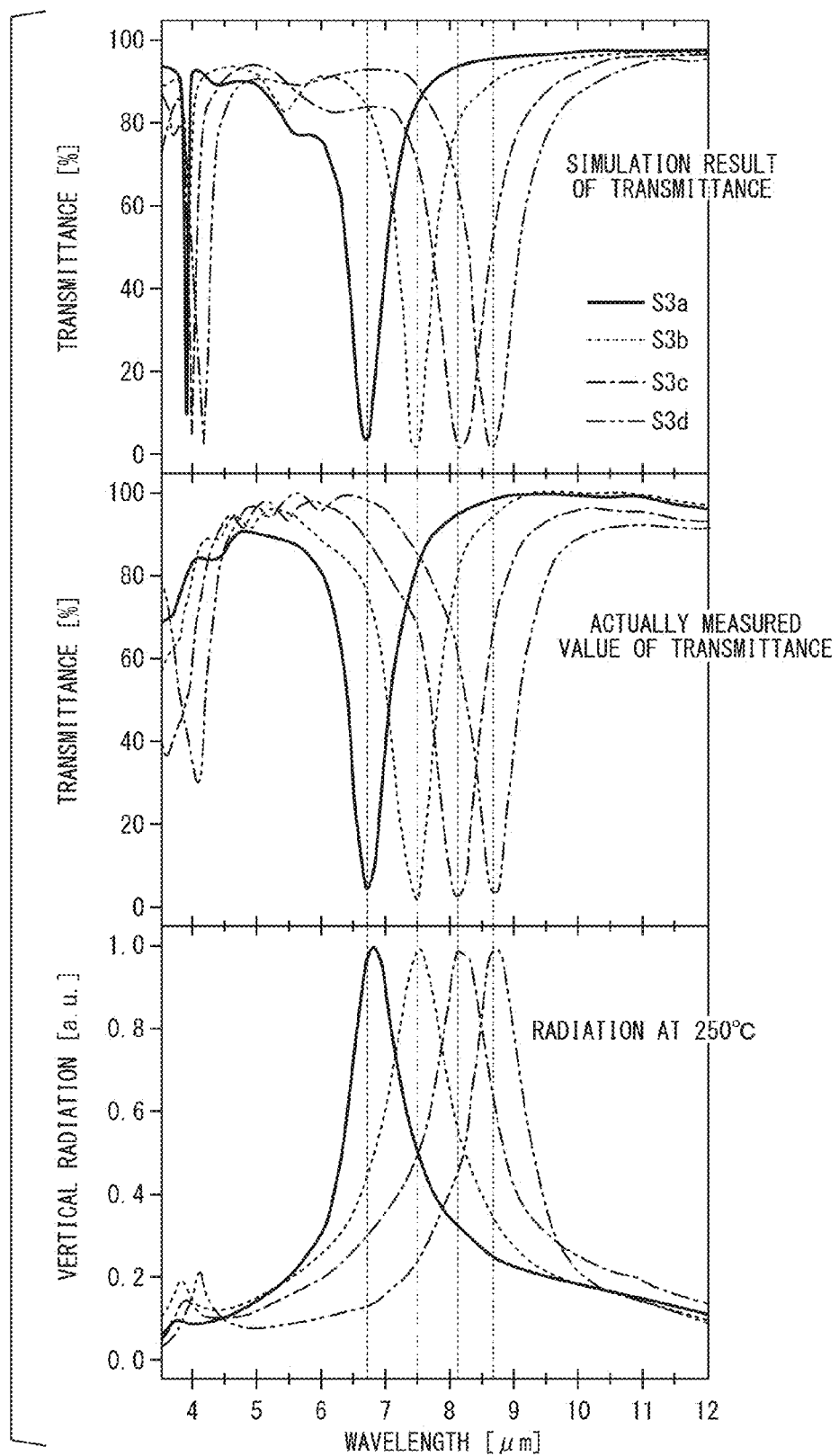
FIG. 9 is a view showing spectra in a case where a diameter of Al discs arranged with a period fixed to 4.4 μm is changed.

FIG. 9 shows measured or simulated results of differences in transmittance and vertical radiation due to the diameter of the conductor discs 16a. Four electromagnetic wave absorbing/radiating materials S3a, S3b, S3c, and S3d in which thicknesses of the first metal layer 12, the first dielectric layer 14, and the second metal layer 16 were respectively 100 nm, 200 nm, and 100 nm, were used. The period (distance between centers of the discs) was set as 4.4 µm, the first and second conductor layers 12 and 16 were formed of Al, and the first dielectric layer 14 was formed of alumina. The diameters of the conductor discs 16a of the four electromagnetic wave absorbing/radiating materials S3a, S3b, S3c, and S3d were respectively set as 6.73 µm (S3a), 7.46 µm (S3b), 8.15 µm (S3c), and 8.65 µm (S3d). The upper diagram and the middle diagram of FIG. 9 show a simulation result and a measured result of transmittance of (spectra of transmittance) of the second metal layer 16 with respect to a wavelength of incident light. The lower diagram of FIG. 9 shows a measured result of a relationship between vertical radiation and a wavelength thereof (radiation spectra). The simulation was performed by using the RCWA method. The transmittance was acquired as a value of "1−reflectivity". The vertical radiation was measured by using the FTIR method. From FIG. 9, it is found that the wavelength showing a minimum peak of the transmittance and a maximum peak of the vertical radiation changed depending on the diameter of the conductor discs 16a.

Second Example

An electromagnetic wave absorbing/radiating material having a disc array structure was manufactured by using Mo which is a highly heat resistant material (raw material) for both of the first metal layer 12 and the second metal layer 16 so as to be functioned up to high temperature and by using alumina for the dielectric layer 14, and the properties thereof were measured using the electromagnetic wave absorbing/radiating material as a sample. Si was used for the base 10 of the electromagnetic wave absorbing/radiating material which was a measurement target, and thicknesses of the Mo first metal layer 12, the alumina dielectric layer 14, and the Mo second metal layer 16 were respectively set as 1 µm, 150 nm, and 100 nm. The diameter of the discs 16a was set as 1.7 µm. When performing radiation measurement here, a measurement device having a configuration which is conceptually shown in FIG. 10 was used. Two vacuum windows were prepared in the configuration of the measurement device of FIG. 10 in order to exchange the used radiation thermometers by only changing an angle of a sample (infrared illuminator), by installing different types of radiation thermometers for each window. The experiment was performed in a vacuum environment with pressure of approximately $10^{-7}$ Torr range, powers of a visible wavelength and infrared light were measured using a power meter (capable of measuring at 0.19 to 25 µm) through ZnSe vacuum window (transmits a wide range from visible light to infrared light), and power was measured using a power meter (capable of measuring at 0.19 to 25 µm) through a quartz vacuum window (transmit visible light and infrared light at a wavelength shorter than 4 µm). In the measurement, transmittance spectra of the window were measured in advance, and correction of radiation power was performed by considering a decrease in transmittance in the window by using the above transmittance spectra.

Figure 11:
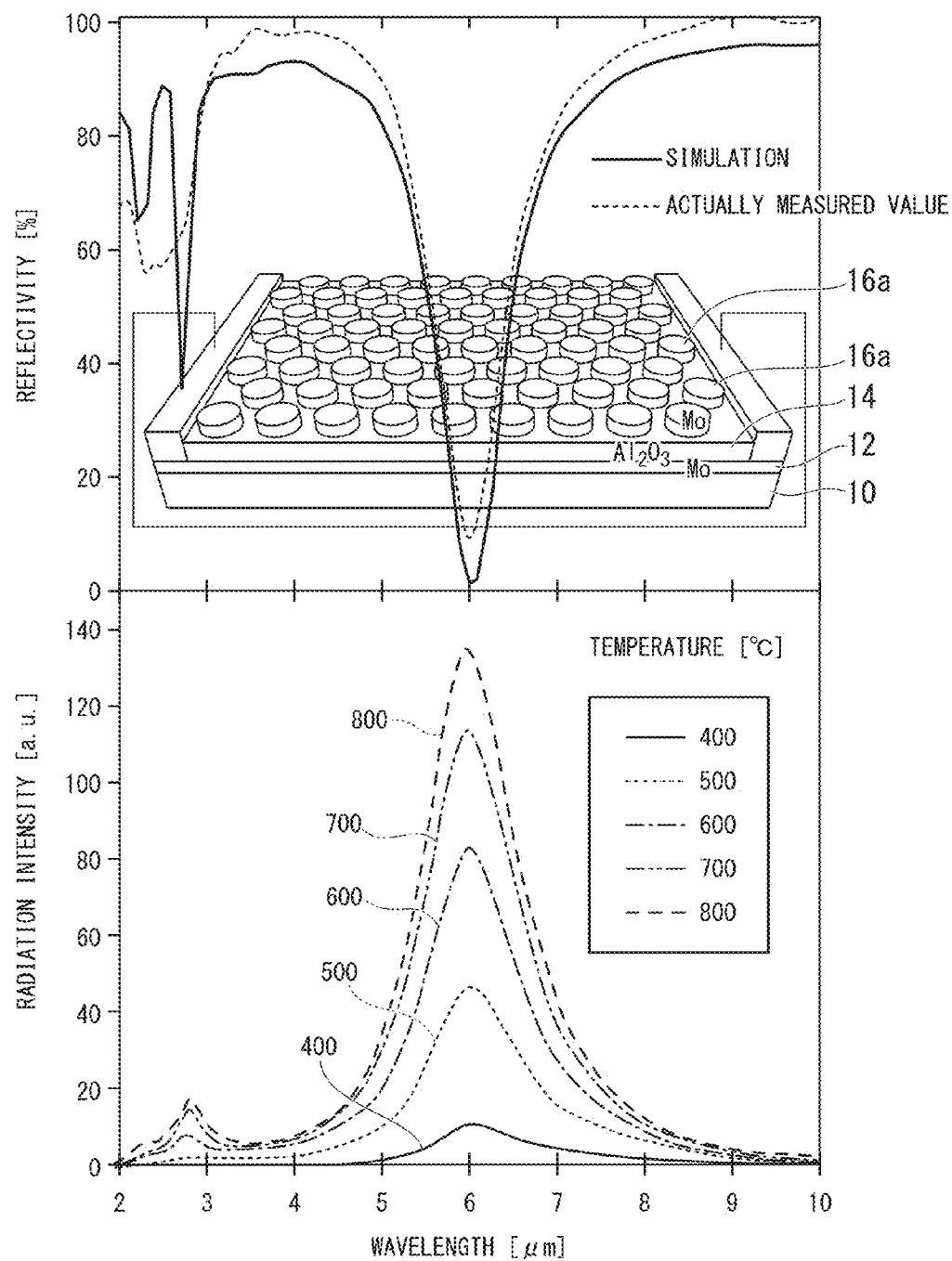
FIG. 11 is a graph (upper side) showing a calculated value (simulation) and an actually measured value of electromagnetic wave absorption spectra of the electromagnetic wave absorbing/radiating material having a disc array structure of the second example, and a graph (lower side) showing an actually measured value of electromagnetic wave radiation spectra.

The upper side of FIG. 11 shows a graph of spectra (solid line: result of theoretical calculation, dotted line: actually measured value) of reflectivity at room temperature of this example, and the lower side thereof shows a graph of actually measured values of radiation intensity spectra in an temperature-increased state.

From the graph on the upper side, the reflectivity obtained by the calculation at a wavelength close to 6 µm was a value close to 0% in the simulation and was a value equal to or smaller than 10% in the experiment (actually measured value). Since this sample did not show transmitting, the actually measured value means that absorption at this wavelength was equal to or greater than 90%.

The result obtained by performing heating in contact with Mo of the first metal layer 12 of this sample in vacuum at pressure of approximately $10^{-7}$ Torr range is spectra on the lower side. The temperature was increased from 400° C. to 800° C. by 100° C. and infrared radiation intensity was measured. It is confirmed that the radiation spectra had a spectra shape which was substantially reverse to spectra of reflectivity as expected and had a great peak at 6 µm. A small radiation peak was also observed on a high energy side at 2.8 µm, but the intensity was small. Accordingly, by being heated, the electromagnetic wave absorbing/radiating material has the center at a wavelength close to 6 µm, and by changing the temperature, it is possible to change only radiation intensity into a reverse wave while substantially maintaining the shape of spectra to be constant. Therefore, it is possible to use the electromagnetic wave absorbing/radiating material as a monochromatic infrared radiating light source. The measured radiation was 0.25 mW/mm² at a distance of 150 mm from the sample at 800° C. The angle distribution of radiation substantially evenly broadens over a range of ±70° in a surface normal direction, and the material can be used as a light source of a device in which wide-angle irradiation is required. For example, the material can be mounted on an infrared camera for performing imaging using infrared light in the night and can be used in a method of measuring reflected light in a wide range.

The electromagnetic wave absorbing/radiating material of this example can also be used as an infrared source at approximately 2 to 3 W by focusing light using a lens or the like. In addition, it is possible to extract such a great energy, the radiation amount is easily increased further, because the electromagnetic wave absorbing/radiating material of the present embodiment easily realizes a large area as described above, and the spectra of infrared light generated is in a narrowband, compared to that of infrared light radiated from a typical heating element, and the center frequency or the shape of spectra thereof is substantially not affected by the temperature. Thus, electromagnetic wave absorbing/radiating material is useful as, for example, an infrared source which can efficiently heat a specific target and can statically and dynamically adjust the radiation amount in a wide range (that is, can continuously use the radiation amount while maintaining a specific value initially set, and change the radiation amount during the operation). The electromagnetic wave absorbing/radiating material of the present embodiment may be used alone as such an infrared source, or an infrared source may be configured as a heating element, an infrared ray generation device capable of realizing various configurations in which various auxiliary constituent elements (a heating element, a control circuit, a sensor, a power supply, or a housing) are incorporated, or more generally, an electromagnetic wave generation device. In this example, the disc array structure is used, but the properties of the infrared/electromagnetic wave generation device described in this example were also obtained even in a case where the hole array structure is used.

Third Embodiment

Figure 12A:
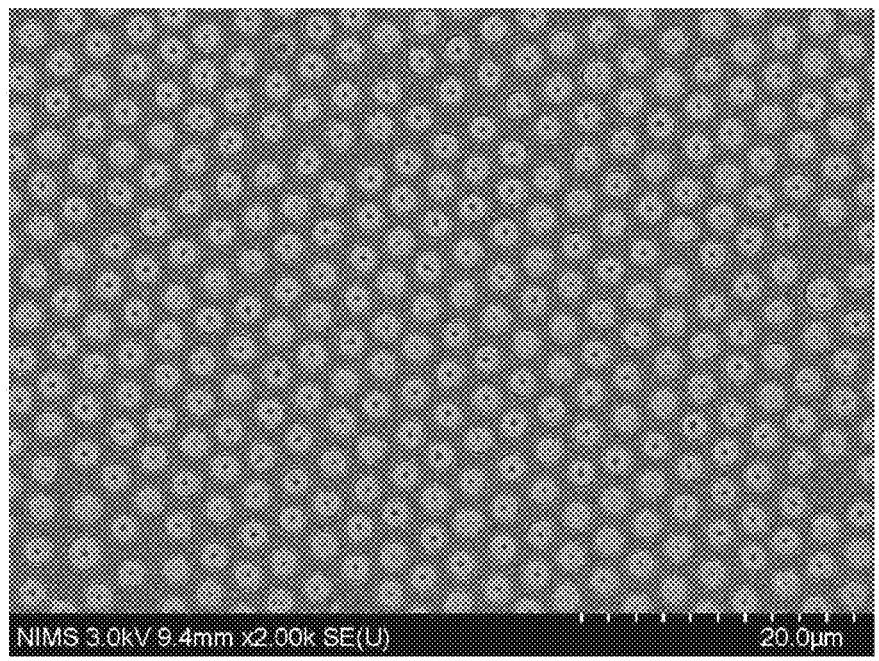
FIG. 12A is a scanning electron microscope (SEM) image obtained by observing an electromagnetic wave absorbing/radiating material having a hole array structure of a third example from a side of a surface of a perforated conductor layer in which holes are arranged.
Figure 12B:
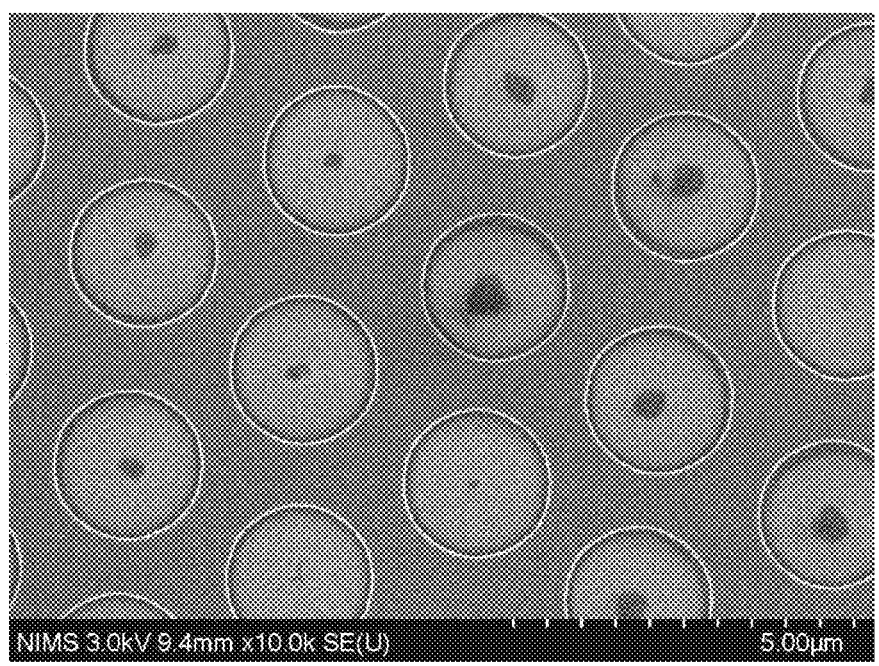
FIG. 12B is an SEM image obtained by observing the third example from a side of a surface of a perforated conductor layer in which holes are arranged, at a higher magnification than that in FIG. 12A.

An electromagnetic wave absorbing/radiating material having the hole array structure conceptually shown in FIG. 2 was manufactured. Specifically, a layer of Mo having a thickness of 0.2 µm was formed as a first conductor layer 12 and a layer of alumina having a thickness of 0.47 µm was formed as the first dielectric layer 14, on a silicon wafer surface as the base 10. As described above, a single layer of polystyrene (PS) spheres B having a diameter of 3 µm was transferred thereon, the sizes of the PS spheres were uniformly decreased by reactive etching to set diameters as 1.1 µm, 1.2 µm, and 1.3 µm, and thereby, a mask was formed. By forming a layer of Mo having a thickness of 0.1 µm on this mask, three types of the perforated conductor layer 26 including the plurality of holes 26a having diameters of 1.1 µm, 1.2 µm, and 1.3 µm were formed, and the hole array structure conceptually shown in FIG. 2 was manufactured. FIGS. 12A and 12B show results obtained by observing a part of the electromagnetic wave absorbing/radiating material having the hole array structure manufactured as described above from a side of the Mo layer 26 in which the holes 26a were arranged by using a scanning electron microscope. FIG. 12B shows results obtained by observing the same surface observed in FIG. 12A at a higher magnification.

Figure 13:
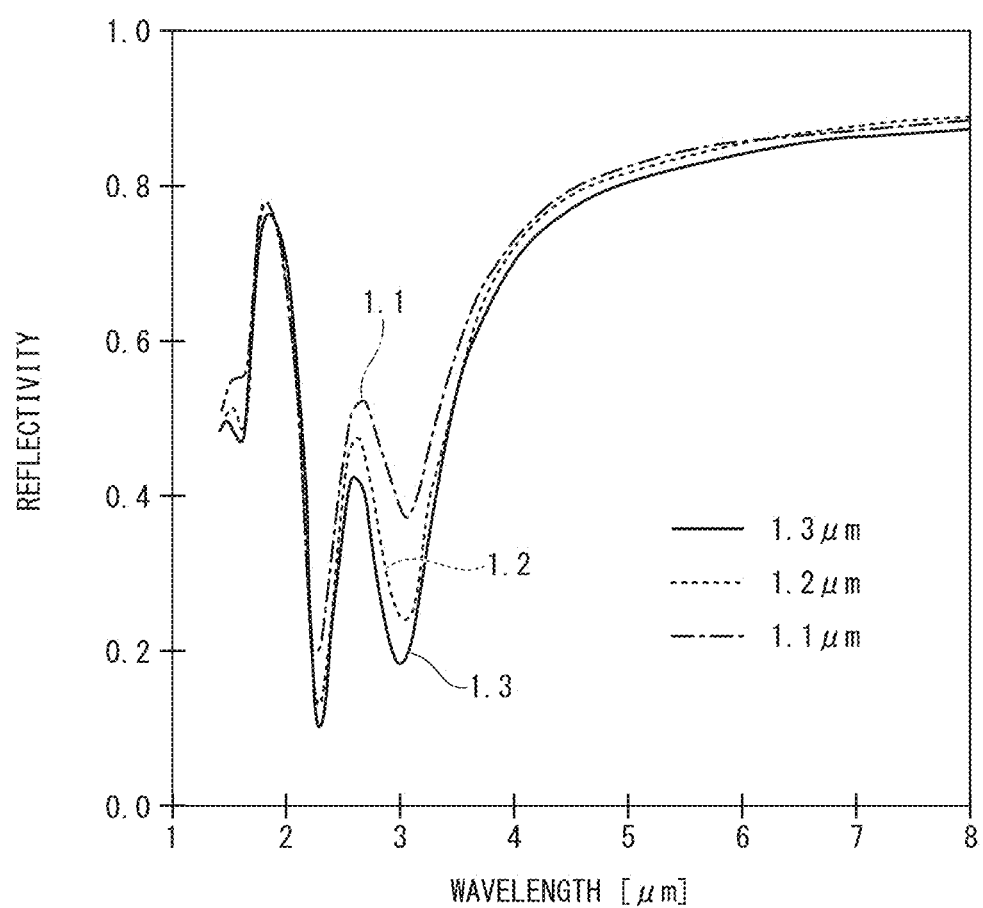
FIG. 13 is a view showing electromagnetic wave absorption spectra of the electromagnetic wave absorbing/radiating material of the third example.

FIG. 13 shows results obtained by measuring reflection spectra of the electromagnetic wave absorbing/radiating material having the hole array structure. It is found that, by changing the hole diameters to have three patterns of 1.1 µm, 1.2 µm, and 1.3 µm, a wavelength of a dip of the reflectivity around a wavelength of 3 µm on a long wavelength side was changed. Although not shown, it is possible to change the position (wavelength) of the reflectivity dip at a wavelength of 2.2 µm of FIG. 13 by changing the thickness of the alumina film. With these properties, it is possible to realize a wavelength-selective absorbing element or a wavelength-selective infrared source, by changing two absorption wavelengths.

INDUSTRIAL APPLICABILITY

As specifically described above, the electromagnetic wave absorbing/radiating material of the present invention (light absorbing/radiating material) can be used in various types of devices including the following configurations, but there is no limitation.

(1) A thermophotovoltaic heat energy-absorbing near infrared light radiating material which can absorb heat rays under a high temperature environment and change an energy thereof into near infrared light.

(2) An infrared detector which is mounted on an infrared detection element, can realize high sensitivity of the element and wavelength selectivity, and detects a specific wavelength. A small-sized high-sensitivity spectroscope in which infrared detection elements are arranged by changing multiwavelengths and diffraction grating or an interferometer is not necessary.

(3) A panel heater which can emit electromagnetic waves at a specific wavelength from middle infrared to near infrared ranges.

(4) An unpolarized type narrowband light source which radiates electromagnetic waves at a specific wavelength in an ultraviolet-middle infrared range.

(5) An unpolarized type detector which absorbs electromagnetic waves at a specific wavelength in an ultraviolet-middle infrared range.

(6) A remote control device using (4) as a light source or using (5) as a detector, or using any one thereof.

(7) A base for high sensitivity spectroscopy such as surface-enhanced infrared absorption or surface-enhanced Raman scattering.

(8) A low-cost infrared source used instead of an LED or a laser having high cost.

(9) A wide-angle infrared source for a small-sized infrared camera.

(10) A near infrared and middle infrared radiating light source in which radiation wavelength is designed according to vibration or absorption wavelength of specific molecules.

(11) A device in which the wavelength-sensitive infrared detection element of (2) and infrared source of (10) are combined with each other. A device which measures a state of a target or presence or absence of a specific material, by disposing a target to be measured between a light source and a wavelength-selective infrared detection element.

(12) An infrared source which efficiently performs the heating by radiating infrared rays at a wavelength obtained depending on the properties of the target.

REFERENCE SIGNS LIST

10: base
12: first metal layer (first conductor layer)

12a: conductor surface
14: first dielectric layer
16: second metal disc layer
16a: conductor disc
26: second metal layer (perforated conductor layer)
26a: hole
B: polystyrene sphere

The invention claimed is:

1. An electromagnetic wave absorbing/radiating material, comprising:
   a conductor; and
   a plurality of conductor discs which are disposed in an array above a surface of the conductor.

2. The electromagnetic wave absorbing/radiating material according to claim 1, further comprising:
   a dielectric layer provided on the surface of the conductor,
   wherein the conductor discs are defined therein in an array on a surface of the dielectric layer.

3. The electromagnetic wave absorbing/radiating material according to claim 1,
   wherein the plurality of conductor discs have the same size.

4. The electromagnetic wave absorbing/radiating material according to claim 1,
   wherein the plurality of conductor discs are circular.

5. The electromagnetic wave absorbing/radiating material according to claim 1,
   wherein at least one of the conductor discs and the surface of the conductor consists of a light metal,
   wherein the light metal is Al, Ti, or an alloy thereof.

6. The electromagnetic wave absorbing/radiating material according to claim 1,
   wherein at least one of the conductor discs and the surface of the conductor consists of a heat resistant material selected from the group consisting of Mo, W, Nb, Ta, Re, $MoSi_2$, TiN, ZrN, HfN, TiC, TaC, $LaB_6$, and $AlB_2$.

7. An infrared source comprising the electromagnetic wave absorbing/radiating material according to claim 1.

8. The electromagnetic wave absorbing/radiating material according to claim 1,
   wherein an average diameter of the conductor discs is in a range of 0.5 to 20 μm.

9. The electromagnetic wave absorbing/radiating material according to claim 1,
   wherein an average thickness of the conductor discs is in a range of 50 nm to 300 nm.

10. The electromagnetic wave absorbing/radiating material according to claim 1,
    wherein the conductor is comprised of metal, alloy, or conductive compound.

11. The electromagnetic wave absorbing/radiating material according to claim 1,
    wherein a diameter of the conductor discs are such that a plasmon resonance is generated in the electromagnetic wave absorbing/radiating material so as to allow absorption of an electromagnetic wave to occur at a wavelength of the plasmon resonance.

12. An electromagnetic wave absorbing/radiating material, comprising:
    a conductor; and
    a perforated conductor layer with a plurality of holes defined therein in an array above a surface of the conductor.

13. The electromagnetic wave absorbing/radiating material according to claim 12, further comprising:
    a dielectric layer provided on the surface of the conductor,
    wherein the perforated conductor layer is disposed on a surface of the dielectric layer.

14. The electromagnetic wave absorbing/radiating material according to claim 12,
    wherein the plurality of holes have the same size.

15. The electromagnetic wave absorbing/radiating material according to claim 12,
    wherein the plurality of holes are circular.

16. The electromagnetic wave absorbing/radiating material according to claim 12,
    wherein at least one of the perforated conductor layer and the surface of the conductor consists of a light metal,
    wherein the light metal is Al, Ti, or an alloy thereof.

17. The electromagnetic wave absorbing/radiating material according to claim 12,
    wherein at least one of the perforated conductor layer and the surface of the conductor consists of a heat resistant material selected from the group consisting of Mo, W, Nb, Ta, Re, $MoSi_2$, TiN, ZrN, HfN, TiC, TaC, $LaB_6$ and $AlB_2$.

18. An infrared source comprising the electromagnetic wave absorbing/radiating material according to claim 12.

19. The electromagnetic wave absorbing/radiating material according to claim 12,
    wherein the conductor is comprised of metal, alloy, or conductive compound.

20. The electromagnetic wave absorbing/radiating material according to claim 12,
    wherein a diameter of the holes defined in the conductor are such that a plasmon resonance is generated in the electromagnetic wave absorbing/radiating material so as to allow absorption of an electromagnetic wave to occur at a wavelength of the plasmon resonance.

21. A method of manufacturing an electromagnetic wave absorbing/radiating material, comprising the steps of:
    forming a dielectric layer on a surface of a first conductor;
    forming a second conductor layer on the dielectric layer;
    disposing a plurality of spheres in a single-layered array on a surface of the second conductor layer;
    etching the second conductor layer using the plurality of spheres as a mask so as to leave the second conductor layer immediately under the plurality of spheres to remain as a plurality of conductor discs; and
    removing the plurality of spheres.

22. The method of manufacturing an electromagnetic wave absorbing/radiating material according to claim 21, further comprising:
    a step of uniformly decreasing sizes of the plurality of spheres before the step of etching the second conductor layer.

23. The method of manufacturing an electromagnetic wave absorbing/radiating material according to claim 22,
    wherein the step of uniformly decreasing sizes of the plurality of spheres is performed by means of reactive etching.

24. The method of manufacturing an electromagnetic wave absorbing/radiating material according to claim 21,
    wherein the step of disposing the plurality of spheres in a single-layered array on the surface of the second conductor layer is performed by floating the plurality of spheres on a surface of liquid and transferring the spheres to the surface of the second conductor layer.

25. The method of manufacturing an electromagnetic wave absorbing/radiating material according to claim 21,
    wherein the plurality of spheres have the same size.

26. The method of manufacturing an electromagnetic wave absorbing/radiating material according to claim 21, wherein at least one of the conductor discs and the surface of the first conductor consists of a light metal, wherein the light metal is Al, Ti, or an alloy thereof.

27. The method of manufacturing an electromagnetic wave absorbing/radiating material according to claim 21, wherein at least one of the conductor discs and the surface of the first conductor consists of a heat resistant material selected from the group consisting of Mo, W, Nb, Ta, Re, $MoSi_2$, TiN, ZrN, HfN, TiC, TaC, $LaB_6$, and $AlB_2$.

28. The method of manufacturing an electromagnetic wave absorbing/radiating material according to claim 21, wherein an average diameter of the conductor discs is in a range of 0.5 to 20 μm.

29. The method of manufacturing an electromagnetic wave absorbing/radiating material according to claim 21, wherein an average thickness of the conductor discs is in a range of 50 nm to 300 nm.

30. The method of manufacturing an electromagnetic wave absorbing/radiating material according to claim 21, wherein the first conductor is comprised of metal, alloy, or conductive compound.

31. The method of manufacturing an electromagnetic wave absorbing/radiating material according to claim 21, wherein a diameter of the conductor discs are such that a plasmon resonance is generated in the electromagnetic wave absorbing/radiating material so as to allow absorption of an electromagnetic wave to occur at a wavelength of the plasmon resonance.

32. A method of manufacturing an electromagnetic wave absorbing/radiating material comprising the steps of:
forming a dielectric layer on a surface of a first conductor;
disposing a plurality of spheres in a single-layered array on a surface of the dielectric layer;
depositing a conductor on the surface of the dielectric layer using the plurality of spheres as a mask to form a perforated conductor layer with holes defined immediately under the plurality of spheres; and
removing the plurality of spheres.

33. The method of manufacturing an electromagnetic wave absorbing/radiating material according to claim 32, further comprising:
a step of uniformly decreasing sizes of the plurality of spheres before the step of depositing the conductor.

34. The method of manufacturing an electromagnetic wave absorbing/radiating material according to claim 33, wherein the step of uniformly decreasing sizes of the plurality of spheres is performed by means of reactive etching.

35. The method of manufacturing an electromagnetic wave absorbing/radiating material according to claim 32, wherein the plurality of spheres have the same size.

36. The method of manufacturing an electromagnetic wave absorbing/radiating material according to claim 32, wherein at least one of the perforated conductor layer and the surface of the first conductor consists of a light metal,
wherein the light metal is Al, Ti, or an alloy thereof.

37. The method of manufacturing an electromagnetic wave absorbing/radiating material according to claim 32, wherein at least one of the perforated conductor layer and the surface of the first conductor consists of a heat resistant material selected from the group consisting of Mo, W, Nb, Ta, Re, $MoSi_2$, TiN, ZrN, HfN, TiC, TaC, $LaB_6$ and $AlB_2$.

38. The method of manufacturing an electromagnetic wave absorbing/radiating material according to claim 32, wherein the first conductor is comprised of metal, alloy, or conductive compound.

39. The method of manufacturing an electromagnetic wave absorbing/radiating material according to claim 32, wherein a diameter of holes defined in the conductor are such that a plasmon resonance is generated in the electromagnetic wave absorbing/radiating material so as to allow absorption of an electromagnetic wave to occur at a wavelength of the plasmon resonance.

\* \* \* \* \*